(12) United States Patent
Mun et al.

(10) Patent No.: US 12,745,473 B2
(45) Date of Patent: Sep. 22, 2026

(54) IMAGE SENSOR INCLUDING NANO-PHOTONIC MICROLENS ARRAY AND ELECTRONIC APPARATUS INCLUDING THE IMAGE SENSOR

(71) Applicant: SAMSUNG ELECTRONICS CO., LTD., Suwon-si (KR)

(72) Inventors: Sangeun Mun, Suwon-si (KR); Sookyoung Roh, Suwon-si (KR); Junho Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 399 days.

(21) Appl. No.: 18/380,914

(22) Filed: Oct. 17, 2023

(65) Prior Publication Data

US 2024/0145509 A1 May 2, 2024

(30) Foreign Application Priority Data

Nov. 2, 2022 (KR) ........................ 10-2022-0144619

(51) Int. Cl.
*H10F 39/00* (2025.01)

(52) U.S. Cl.
CPC ................................ *H10F 39/8063* (2025.01)

(58) Field of Classification Search
CPC ............... H10F 39/8063; H10F 39/182; H10F 39/8023; H10F 39/802; B82Y 20/00
See application file for complete search history.

(56) References Cited

U.S. PATENT DOCUMENTS

| | | | | |
|---|---|---|---|---|
| 8,004,595 | B2 | 8/2011 | Onozawa | |
| 9,978,789 | B2 | 5/2018 | Lin et al. | |
| 2006/0214250 | A1 * | 9/2006 | Mouli | H10F 39/8063 257/432 |
| 2008/0272454 | A1 | 11/2008 | Toshikiyo et al. | |

(Continued)

FOREIGN PATENT DOCUMENTS

| | | | |
|---|---|---|---|
| JP | 4531843 | B2 | 8/2010 |
| JP | 2022-051762 | A | 4/2022 |

(Continued)

OTHER PUBLICATIONS

Communication issued on Nov. 15, 2023 by the Korean Intellectual Property Office for Korean Patent Application No. 10-2022-0144619.

(Continued)

*Primary Examiner* — Changhyun Yi
(74) *Attorney, Agent, or Firm* — Sughrue Mion, PLLC

(57) ABSTRACT

An image sensor includes a sensor substrate including a plurality of pixels for sensing incident light, and a nano-photonic microlens array including a plurality of nano-photonic microlenses corresponding respectively to the plurality of pixels, wherein each of the plurality of nano-photonic microlenses includes a plurality of nano-structures that are arranged two-dimensionally to condense incident light onto corresponding pixels, and a gap between two nano-structures that are arranged directly facing each other across a boundary between two adjacent nano-photonic microlenses is greater than an arrangement period of the plurality of nano-structures in each of the plurality of nano-photonic microlenses.

19 Claims, 29 Drawing Sheets

(56) References Cited

U.S. PATENT DOCUMENTS

| | | | |
|---|---|---|---|
| 2016/0126277 | A1 | 5/2016 | Kim |
| 2019/0196183 | A1 | 6/2019 | Yokogawa |
| 2021/0048342 | A1 | 2/2021 | Kim et al. |
| 2021/0118932 | A1 | 4/2021 | Cho et al. |
| 2022/0326415 | A1 | 10/2022 | Yun et al. |
| 2023/0020980 | A1 | 1/2023 | Mun et al. |
| 2023/0139533 | A1 | 5/2023 | Mun et al. |
| 2024/0015383 | A1 | 1/2024 | Mun et al. |

FOREIGN PATENT DOCUMENTS

| | | | |
|---|---|---|---|
| KR | 10-2021-0046989 | A | 4/2021 |
| KR | 10-2022-0096967 | A | 7/2022 |

OTHER PUBLICATIONS

European Extended Search Report issued Mar. 25, 2024 by the European Patent Office for EP Patent Application No. 23206154.9.

* cited by examiner

| G | B | G | B | G | B | G | B |
|---|---|---|---|---|---|---|---|
| R | G | R | G | R | G | R | G |
| G | B | G | B | G | B | G | B |
| R | G | R | G | R | G | R | G |
| G | B | G | B | G | B | G | B |
| R | G | R | G | R | G | R | G |

FIG. 2B

| C | M | C | M | C | M | C | M |
|---|---|---|---|---|---|---|---|
| Y | G | Y | G | Y | G | Y | G |
| C | M | C | M | C | M | C | M |
| Y | G | Y | G | Y | G | Y | G |
| C | M | C | M | C | M | C | M |
| Y | G | Y | G | Y | G | Y | G |
| C | M | C | M | C | M | C | M |
| Y | G | Y | G | Y | G | Y | G |

FIG. 2C

| R | G | R | G | R | G | R | G |
|---|---|---|---|---|---|---|---|
| B | W | B | W | B | W | B | W |
| R | G | R | G | R | G | R | G |
| B | W | B | W | B | W | B | W |
| R | G | R | G | R | G | R | G |
| B | W | B | W | B | W | B | W |
| R | G | R | G | R | G | R | G |
| B | W | B | W | B | W | B | W |

IMAGE SENSOR INCLUDING NANO-PHOTONIC MICROLENS ARRAY AND ELECTRONIC APPARATUS INCLUDING THE IMAGE SENSOR

CROSS-REFERENCE TO RELATED APPLICATION

This application is based on and claims priority under 35 U.S.C. § 119 to Korean Patent Application No. 10-2022-0144619, filed on Nov. 2, 2022, in the Korean Intellectual Property Office, the disclosure of which is incorporated by reference herein in its entirety.

BACKGROUND

1. Field

One or more embodiments relate to an image sensor including a nano-photonic microlens array and an electronic apparatus including the same.

2. Description of Related Art

As the resolution of an image sensor increases, a size of a unit pixel in the image sensor has been gradually decreased. Accordingly, a chief ray angle (CRA) has been increasing at an edge of an image sensor. A chief ray is incident perpendicularly to a center portion of an image sensor, and is incident while being inclined to an edge of the image sensor. Toward the edge of the image sensor, the CRA increases. As a result, a sensitivity at the edge of the image sensor may be decreased. Due to the inclined chief ray, a crosstalk issue may occur.

SUMMARY

Provided are an image sensor including a nano-photonic microlens array, capable of improving issues of reducing sensitivity at an edge of the image sensor due to inclined chief ray angle and of generating crosstalk, and an electronic apparatus including the image sensor.

Additional aspects will be set forth in the description which follows. Additional aspects will also be apparent to one skilled in the art based on the description, or may be learned by practice of the presented embodiments of the disclosure.

According to an embodiment, an image sensor includes a sensor substrate including a plurality of pixels for sensing incident light, and a nano-photonic microlens array including a plurality of nano-photonic microlenses, each of the plurality of nan-photonic microlenses corresponding respectively to one of the plurality of pixels, wherein each of the plurality of nano-photonic microlenses includes a plurality of nano-structures that are arranged two-dimensionally so as to condense incident light onto its corresponding respective pixel, wherein a gap between two nano-structures that are arranged directly facing each other across a boundary between two adjacent nano-photonic microlenses is greater than an arrangement period between the plurality of nano-structures in each of the plurality of nano-photonic microlenses.

In an entire area of the nano-photonic microlens array, the arrangement period of the plurality of nano-structures may be consistent in each of the plurality of nano-photonic microlenses, and the gap between two nano-structures that are arranged directly facing each other across the boundary between two adjacent nano-photonic microlenses may be consistent.

The arrangement period of the plurality of nano-structures may be gradually reduced in each of the plurality of nano-photonic microlenses from a center portion toward an edge of the nano-photonic microlens array, and the gap between two adjacent nano-structures that are arranged directly facing each other across the boundary between two adjacent nano-photonic microlenses may be gradually increased from the center portion toward the edge of the nano-photonic microlens array.

When a width of one nano-photonic microlens in a first direction is $W_x$, the arrangement period of the plurality of nano-structures in each of the plurality of nano-photonic microlenses in the first direction is $P_x$, and a number of the nano-structures arranged in the first direction in one nano-photonic microlens is $N_x$, the expression $$P_x = \frac{W_x}{N_x} - \alpha$$

may be satisfied, and

α may have a value greater than 0 at a periphery portion of the nano-photonic microlens array.

When the gap in the first direction between two nano-structures that are arranged directly facing each other across the boundary between two adjacent nano-photonic microlenses is $G_x$, $$G_x - P_x = N_x \cdot \alpha$$

may be satisfied.

The value of α may be consistent throughout an entire area of the nano-photonic microlens array.

The value of α may be 0 at a center portion of the nano-photonic microlens array.

The plurality of nano-structures may be arranged so that the value of α is proportional to a chief ray angle (CRA) of incident light incident onto the nano-photonic microlens array, and the value of α may be gradually or discontinuously increased toward the edge of the nano-photonic microlens array.

The nano-photonic microlens array may include a first section at a center portion and a second section at a periphery portion surrounding the first section, wherein a peripheral arrangement period of the plurality of nano-structures in the plurality of nano-photonic microlenses arranged in the second section may be less than a center arrangement period of the plurality of nano-structures in the plurality of nano-photonic microlenses arranged in the first section, and a peripheral gap between two nano-structures that are arranged directly facing each other across a boundary between two adjacent nano-photonic microlenses in the second section may be greater than a center gap between two nano-structures that are arranged directly facing each other across a boundary between two adjacent nano-photonic microlenses in the first section.

A center arrangement period of the plurality of nano-structures in each of the plurality of nano-photonic microlenses and the center gap between two nano-structures that are arranged directly facing each other across the boundary between two adjacent nano-photonic microlenses may be consistent in the first section, and the peripheral arrangement period of the plurality of nano-structures in each of the plurality of nano-photonic microlenses and the peripheral gap between two nano-structures that are arranged directly facing each other across the boundary between two adjacent nano-photonic microlenses may be consistent in the second section.

The center arrangement period of the plurality of nano-structures in each of the plurality of nano-photonic microlenses may be equal to the center gap between two nano-structures that are arranged directly facing each other across the boundary between two adjacent nano-photonic microlenses in the first section.

A difference between the gap between two nano-structures that are arranged directly facing each other across the boundary between two adjacent nano-photonic microlenses and the arrangement period of the plurality of nano-structures in each of the plurality of nano-photonic microlens may be about 0 to about 300 nm.

The difference between the gap between two nano-structures that are arranged directly facing each other across the boundary between two adjacent nano-photonic microlenses and the arrangement period of the plurality of nano-structures in each of the plurality of nano-photonic microlens may be greater than 0 and may be equal to or less than about 30% of a width of each pixel.

In each of the plurality of nano-photonic microlenses, the plurality of nano-structures may be arranged so that light passing through each of the nano-photonic microlenses may have a convex-shaped phase profile.

A phase profile of light that has passed through the plurality of nano-photonic microlens at a center portion of the nano-photonic microlens array may have a symmetrical shape in a first direction and a symmetrical shape in a second direction.

The plurality of nano-photonic microlenses arranged on a periphery portion of the nano-photonic microlens array may be configured to condense light onto a center portion of a corresponding pixel by deviating the light that is obliquely incident on the nano-photonic microlens array.

The light that has passed through the plurality of nano-photonic microlenses arranged on a periphery portion of the nano-photonic microlens array may have a phase profile, in which an inclined linear phase profile and a convex phase profile are added.

The nano-photonic microlens array may include a first nano-photonic microlens array and a second nano-photonic microlens array disposed on the first nano-photonic microlens array, the first nano-photonic microlens array may include a plurality of first nano-structures and the second nano-photonic microlens array may include a plurality of second nano-structures disposed on the first nano-structures, and a first gap between two first nano-structures that are arranged directly facing each other across a boundary between two adjacent first nano-photonic microlenses may be equal to a second gap between two second nano-structures that are arranged directly facing each other across a boundary between two adjacent second nano-photonic microlenses.

In a periphery portion of the nano-photonic microlens array, the plurality of second nano-structures may be shifted toward a center portion of the nano-photonic microlens array with respect to the plurality of first nano-structures.

According to an embodiment, an electronic apparatus includes a lens assembly for forming an optical image of a subject, an image sensor configured to convert the optical image formed by the lens assembly into an electrical signal, and a processor configured to process a signal generated by the image sensor, wherein the image sensor may include a sensor substrate including a plurality of pixels for sensing incident light, and a nano-photonic microlens array including a plurality of nano-photonic microlenses, each of the plurality of nano-photonic microlenses corresponding respectively to one of the plurality of pixels, and each of the plurality of nano-photonic microlenses includes a plurality of nano-structures that are arranged two-dimensionally to condense incident light onto corresponding respective pixels, and a gap between two nano-structures that are arranged directly facing each other across a boundary between two adjacent nano-photonic microlenses is greater than an arrangement period between the plurality of nano-structures in each of the plurality of nano-photonic microlens.

BRIEF DESCRIPTION OF THE DRAWINGS

The above and other aspects, features, and advantages of certain embodiments of the disclosure will be more apparent from the following description taken in conjunction with the accompanying drawings, in which:

FIGS. 2A, 2B and 2C are diagrams showing examples of various pixel arrangements in a pixel array of an image sensor;

DETAILED DESCRIPTION

Figure 1:
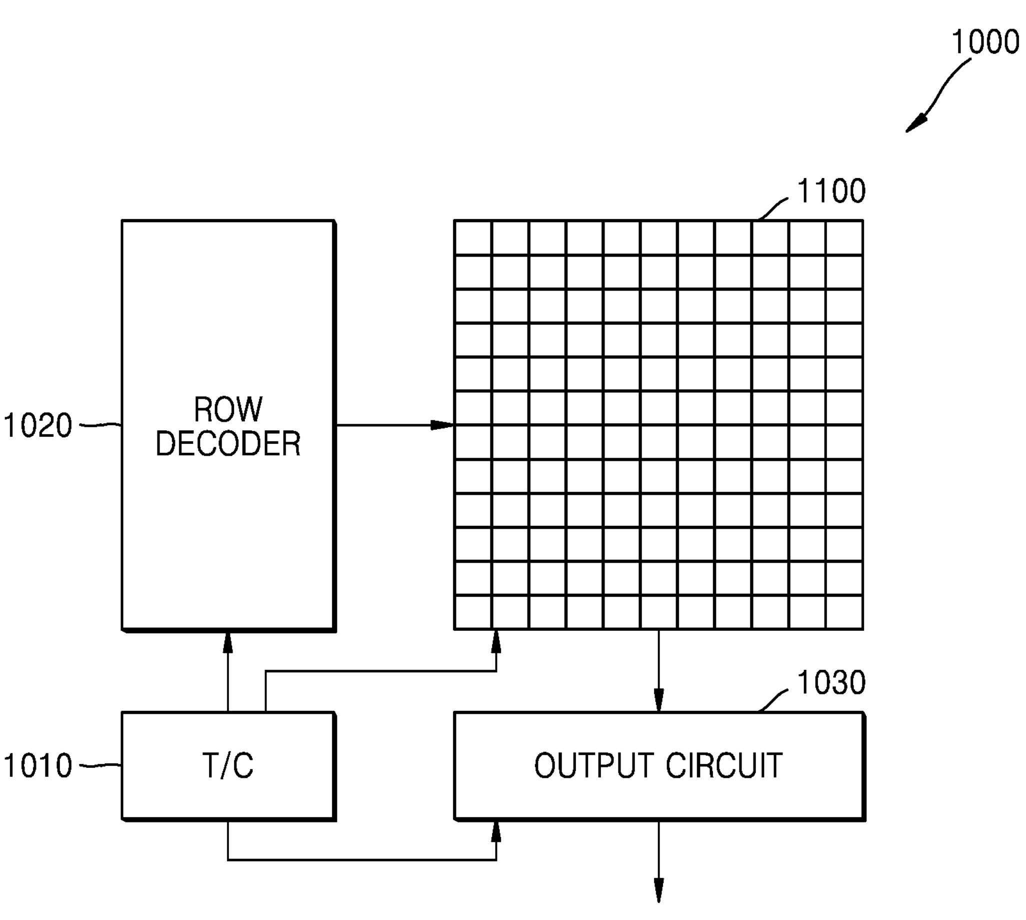
FIG. 1 is a block diagram of an image sensor according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, an image sensor including a nano-photonic microlens array and an electronic apparatus including the image sensor will be described in detail with reference to accompanying drawings. The embodiments of the disclosure are capable of various modifications and may be embodied in many different forms. In the drawings, like reference numerals denote like components, and sizes of components in the drawings may be exaggerated for convenience of explanation.

When a layer, a film, a region, or a panel is referred to as being "on" another element, it may be directly on/under/at left/right sides of the other layer or substrate, or intervening layers may also be present.

It will be understood that although the terms "first," "second," etc. may be used herein to describe various components, these components should not be limited by these terms. These components are only used to distinguish one component from another. These terms do not limit that materials or structures of components are different from one another.

An expression used in the singular encompasses the expression of the plural, unless it has a clearly different meaning in the context. It will be further understood that when a portion is referred to as "comprises" another component, the portion may not exclude another component but may further comprise another component unless the context states otherwise.

In addition, the terms such as " . . . unit", "module", etc. provided herein indicates a unit performing a function or operation, and may be realized by hardware (such as a processor), software, or a combination of hardware and software.

The use of the terms of "the above-described" and similar indicative terms may correspond to both the singular forms and the plural forms.

Also, the steps of all methods described herein may be performed in any suitable order unless otherwise indicated herein or otherwise clearly contradicted by context. Also, the use of all exemplary terms (for example, etc.) is only to describe a technical spirit in detail, and the scope of rights is not limited by these terms unless the context is limited by the claims.

FIG. 1 is a schematic block diagram of an image sensor 1000 according to an embodiment. Referring to FIG. 1, the image sensor 1000 may include a pixel array 1100, a timing controller 1010, a row decoder 1020, and an output circuit 1030. The image sensor 1000 may include a charge-coupled device (CCD) image sensor or a complementary metal oxide semiconductor (CMOS) image sensor.

The pixel array 1100 includes pixels that are two-dimensionally arranged in a plurality of rows and columns. The row decoder 1020 selects one of the rows in the pixel array 1100 in response to a row address signal output from the timing controller 1010. The output circuit 1030 outputs a photosensitive signal, in a column unit, from a plurality of pixels arranged in the selected row. To this end, the output circuit 1030 may include a column decoder and an analog-to-digital converter (ADC). For example, the output circuit 1030 may include a plurality of ADCs that are arranged respectively to columns between the column decoder and the pixel array 1100, or one ADC arranged at an output end of the column decoder. The timing controller 1010, the row decoder 1020, and the output circuit 1030 may be implemented as one chip or in separate chips. A processor for processing an image signal output from the output circuit 1030 may be implemented as one chip with the timing controller 1010, the row decoder 1020, and the output circuit 1030.

The pixel array 1100 may include a plurality of pixels that sense light of different wavelengths. The pixel arrangement may be implemented in various ways. For example, FIGS. 2A to 2C show various pixel arrangements in the pixel array 1100 of the image sensor 1000.

Figure 2A:
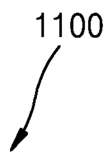
Figure 2A:
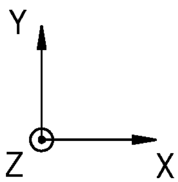

FIG. 2A shows a Bayer pattern that is generally adopted in the image sensor 1000. Referring to FIG. 2A, one unit pattern includes four quadrant regions, and first through fourth quadrants may be the blue pixel B, the green pixel G, the red pixel R, and the green pixel G, respectively. The unit patterns may be repeatedly and two-dimensionally arranged in a first direction (X direction) and a second direction (Y direction). In other words, two green pixels G are arranged in one diagonal direction and one blue pixel B and one red pixel R are arranged in another diagonal direction in a unit pattern of a 2×2 array. In the entire arrangement of pixels, a first row in which a plurality of green pixels G and a plurality of blue pixels B are alternately arranged in the first direction and a second row in which a plurality of red pixels R and a plurality of green pixels G are alternately arranged in the first direction are repeatedly arranged in a second direction.

The pixel array 1100 may be arranged in various arrangement patterns, rather than the Bayer pattern. For example, referring to FIG. 2B, a CYGM arrangement, in which a magenta pixel M, a cyan pixel C, a yellow pixel Y, and a green pixel G configure one unit pattern, may be used. Also, referring to FIG. 2C, an RGBW arrangement, in which a green pixel G, a red pixel R, a blue pixel, and a white pixel W configure one unit pattern, may be used. Although not shown in the drawings, the unit pattern may have a 3×2 array form. In addition to the above examples, the pixels in the pixel array 1100 may be arranged in various ways according to color characteristics of the image sensor 1000. Hereinafter, it will be described that the pixel array 1100 of the image sensor 1000 has a Bayer pattern, but the operating principles may be applied to other patterns of pixel arrangement than the Bayer pattern.

Hereinafter, for convenience of description, an example in which the pixel array 1100 has a Bayer pattern structure will be described as an example.

Figure 3A:
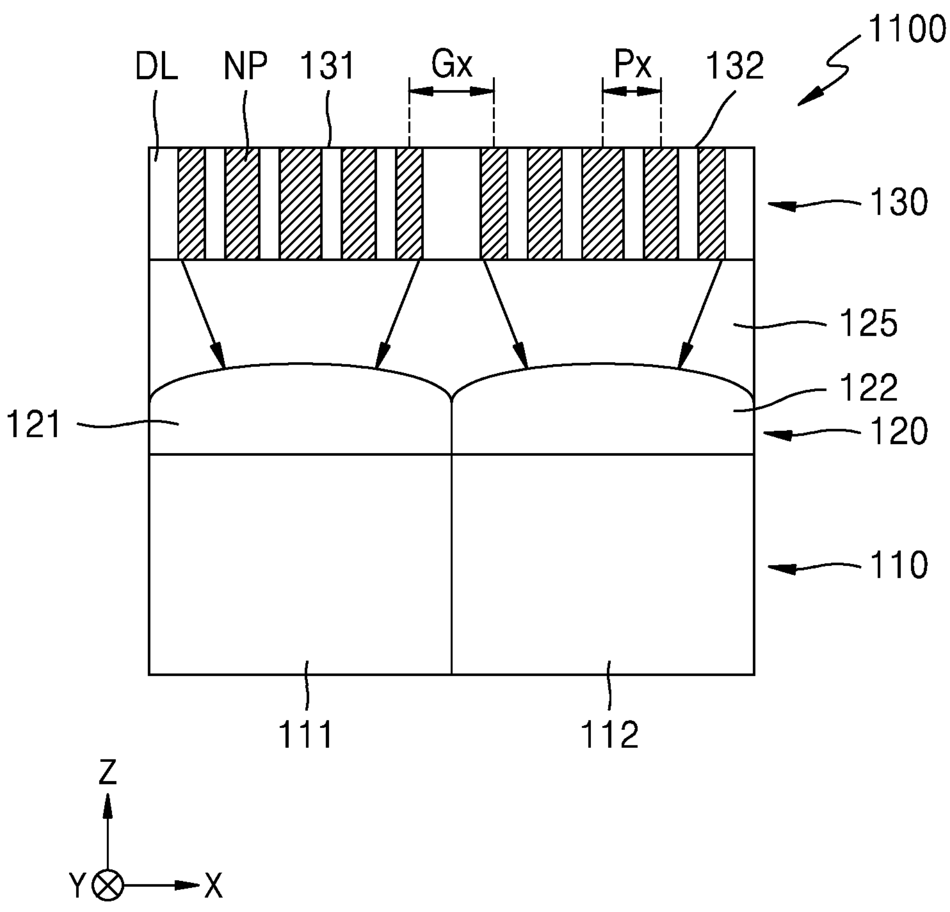
FIGS. 3A and 3B are cross-sectional views schematically illustrating a structure at a center portion of a pixel array in an image sensor according to an embodiment, viewed from different cross-sections.
Figure 3B:
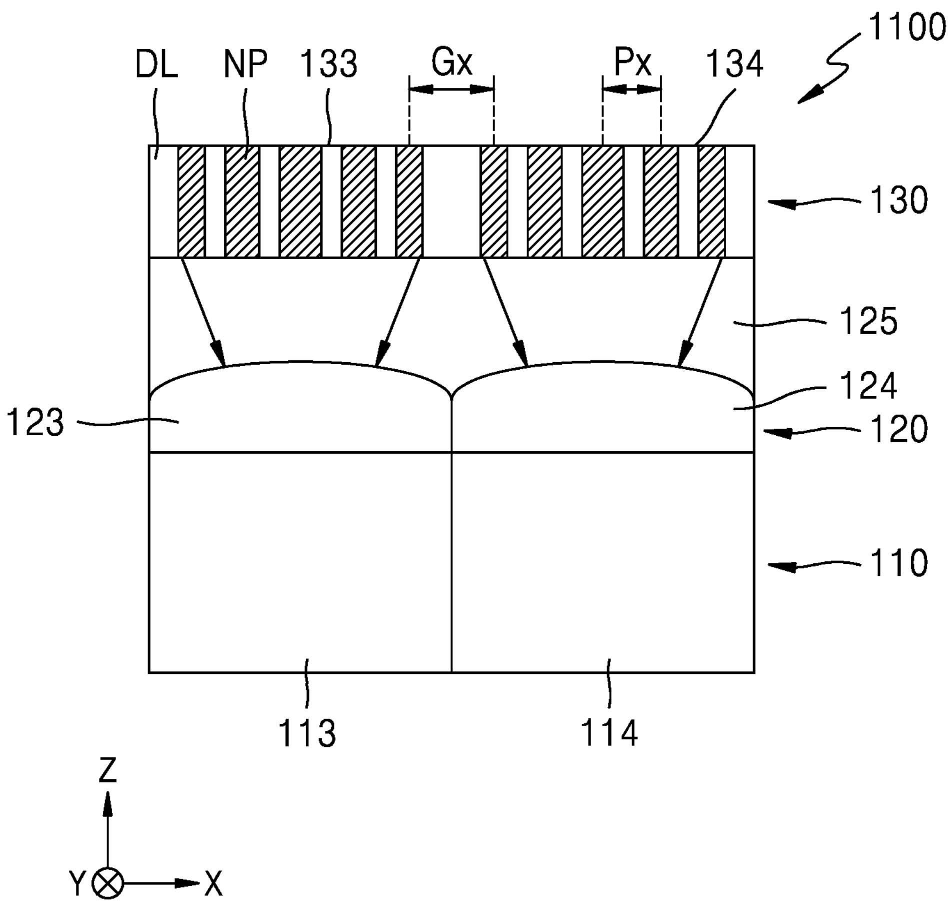

FIGS. 3A and 3B are cross-sectional views schematically illustrating a structure at a center portion of the pixel array 1100 in the image sensor 1000 according to an embodiment, viewed from different cross-sections. FIG. 3A shows a cross-section of the pixel array 1100 taken along the first direction (X-direction), and FIG. 3B shows a cross-section of the pixel array 1100, taken along the first direction (X-direction) and at a different location from the cross-section of FIG. 3A along the second direction (Y-direction). Referring to FIGS. 3A and 3B, the pixel array 1100 of the image sensor 1000 may include a sensor substrate 110, a color filter layer 120 disposed on the sensor substrate 110, and a nano-photonic microlens array 130 disposed on the color filter layer 120.

The sensor substrate 110 may include a plurality of pixels sensing incident light. For example, the sensor substrate 110 may include a first pixel 111, a second pixel 112, a third pixel 113, and a fourth pixel 114 that convert incident light into electrical signals and generate an image signal. The first pixel 111, the second pixel 112, the third pixel 113, and the fourth pixel 114 may form one unit Bayer pattern. For example, the first and fourth pixels 111 and 114 may be green pixels sensing green light, the second pixel 112 may be a blue pixel sensing blue light, and the third pixel 113 may be a red pixel sensing red light. FIGS. 3A and 3B only show one unit Bayer pattern including four pixels as an example, but the pixel array 1100 may include a plurality of Bayer patterns that are two-dimensionally arranged. For example, a plurality of first pixels 111 and a plurality of second pixels 112 may be alternately arranged in a first direction (X-direction), and a plurality of third pixels 113 and a plurality of fourth pixels 114 may be alternately arranged in the first direction (X-direction) on a cross-section located at a different position along a second direction (Y-direction) perpendicular to the first direction (X-direction).

The color filter layer 120 may be arranged between the sensor substrate 110 and the nano-photonic microlens array 130. The color filter layer 120 may include a plurality of color filters respectively transmitting light of different wavelengths in the incident light. The plurality of color filters may correspond to the plurality of pixels of the sensor substrate 110 in one-to-one correspondence. Each of the plurality of color filters may be arranged facing a corresponding pixel from among the plurality of pixels of the sensor substrate 110. For example, the color filter layer 120 may include a first color filter 121 facing the first pixel 111, a second color filter 122 facing the second pixel 112, a third color filter 123 facing the third pixel 113, and a fourth color filter 124 facing the fourth pixel 114. Like the first to fourth pixels 111, 112, 113, and 114, the plurality of first to fourth color filters 121, 122, 123, and 124 may be two-dimensionally arranged in the first direction (X-direction) and the second direction (Y-direction).

For example, the first and fourth color filters 121 and 124 may be green filters that transmit light of green wavelength band in the incident light, the second color filter 122 may be a blue filter that transmits light of blue wavelength band in the incident light, and the third color filter 123 may be a red filter that transmits light of red wavelength band in the incident light. The first to fourth color filters 121, 122, 123, and 124 may include organic color filters including an organic dye or an organic pigment.

Also, the color filter layer 120 may further include a planarization layer 125 on the plurality of first to fourth color filters 121, 122, 123, and 124. An upper surface of each of the first to fourth color filters 121, 122, 123, and 124 may not be flat. Also, thicknesses of the first to fourth color filters 121, 122, 123, and 124 and the black matrix may not be identical to each other. The planarization layer 125 may provide a flat surface for forming the nano-photonic microlens array 130 on the color filter layer 120. The planarization layer 125 may include an organic polymer material that is suitable to be deposited on the first to fourth filters 121, 122, 123, and 124 formed of an organic material and is easy to form a flat surface. The organic polymer material forming the planarization layer 125 may be transparent with respect to visible light. For example, the planarization layer 125 may include at least one organic polymer material from an epoxy resin, polyimide, polycarbonate, polyacrylate, and polymethyl methacrylate (PMMA). However, when the first to fourth color filters 121, 122, 123, and 124 have the same thickness and flat upper surfaces, the planarization layer 125 may be omitted.

The nano-photonic microlens array 130 may be disposed on the upper surface of the color filter layer 120, facing a light-incident surface of the sensor substrate 110. The nano-photonic microlens array 130 may include a plurality of nano-photonic microlenses 131, 132, 133, and 134. The plurality of nano-photonic microlenses 131, 132, 133, and 134 may be in one-to-one correspondence with the plurality of color filters 121, 122, 123, and 124 and with a plurality of pixels 111, 112, 113, and 114. For example, the nano-photonic microlens array 130 may include a first nano-photonic microlens 131 on the first color filter 121, a second nano-photonic microlens 132 on the second color filter 122, a third nano-photonic microlens 133 on the third color filter 123, and a fourth nano-photonic microlens 134 on the fourth color filter 124. Therefore, the first nano-photonic microlens 131 and the second nano-photonic microlens 132 are alternately arranged in the first direction, and in a cross-section located at position in the second direction which is different from FIG. 3A, the third nano-photonic microlens 133 and the fourth nano-photonic microlens 134 may be alternately arranged in the first direction.

The first to fourth nano-photonic microlenses 131, 132, 133, and 134 may be two-dimensionally arranged in the first and second directions so as to face the corresponding color filters and corresponding pixels. For example, the first pixel 111, the first color filter 121, and the first nano-photonic microlens 131 may be arranged facing one another in a third direction (Z direction) that is perpendicular to the first and second directions. Also, the second pixel 112, the second color filter 122, and the second nano-photonic microlens 132 face one another in the third direction, the third pixel 113, the third color filter 123, and the third nano-photonic microlens 133 face one another in the third direction, and the fourth pixel 114, the fourth color filter 124, and the fourth nano-photonic microlens 134 face one another in the third direction.

The first to fourth nano-photonic microlenses 131, 132, 133, and 134 may be configured to condense light onto corresponding pixels from among the first to fourth pixels 111, 112, 113, and 114. For example, the first nano-photonic microlens 131 condenses the incident light onto the first pixel 111, the second nano-photonic microlens 132 condenses the incident light onto the second pixel 112, the third nano-photonic microlens 133 condenses the incident light onto the third pixel 113, and the fourth nano-photonic microlens 134 condenses the incident light onto the fourth pixel 114. In the incident light that is condensed, green light passes through the first and fourth color filters 121 and 124 and may be condensed onto the first and fourth pixels 111 and 114, blue light passes through the second color filter 122 and may be condensed onto the second pixel 112, and red light passes through the third color filter 123 and may be condensed onto the third pixel 113.

To do this, the first to fourth nano-photonic microlenses 131, 132, 133, and 134 may each have a nano-pattern structure for condensing light. The nano-pattern structure may include a plurality of nano-structures NP that change a phase of incident light according to an incident position. Shapes, sizes (widths and heights), intervals, and arrangement types of the plurality of nano-structures NP may be determined such that the light immediately after passing through each of the first to fourth nano-photonic microlenses 131, 132, 133, and 134 may have a certain phase profile. According to the phase profile, a proceeding direction and a focal length of the light after passing through each of the first to fourth nano-photonic microlenses 131, 132, 133, and 134 may be determined.

Figure 4:
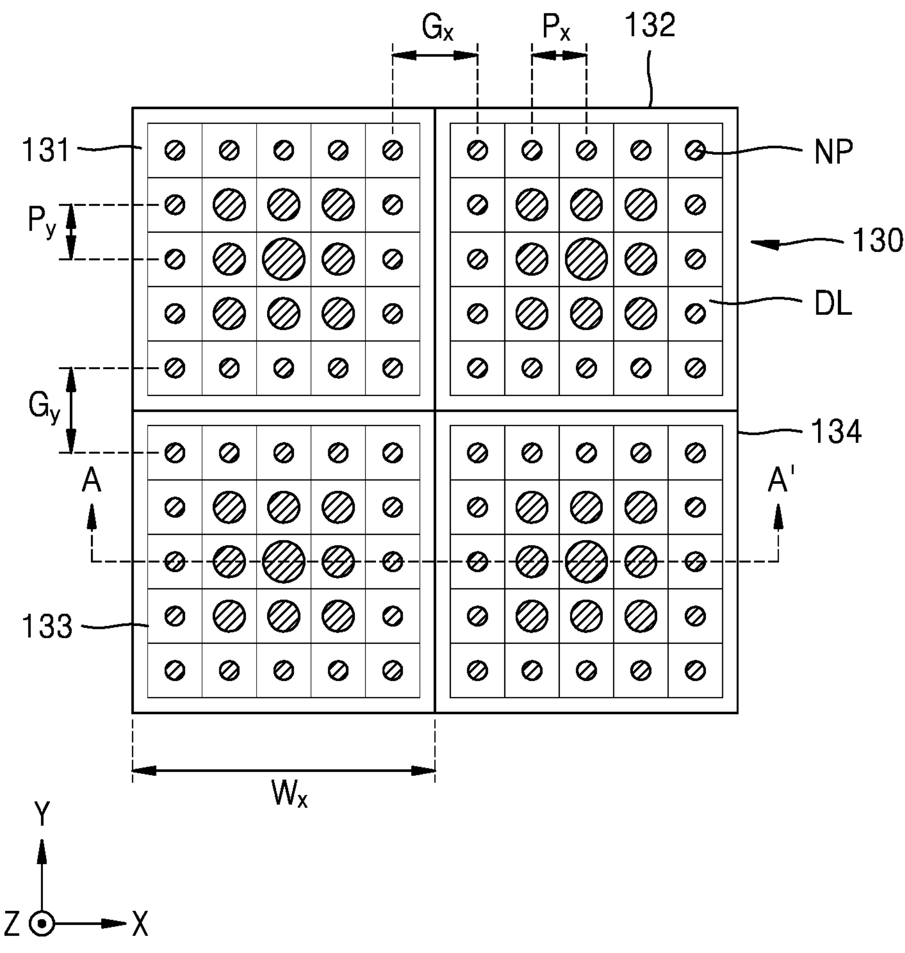
FIG. 4 is a plan view showing an example of a nano-pattern structure at a center portion of a nano-photonic microlens array in an image sensor according to an embodiment.

FIG. 4 is a plan view showing an example of a nano-pattern structure at a center portion of the nano-photonic microlens array 130 in the image sensor 1000 according to an embodiment. Referring to FIG. 4, the nano-structures NP in the nano-pattern structure may be each formed as a nano-post, a cross-section of which has a diameter having sub-wavelength dimensions. Here, the sub-wavelength refers to a wavelength that is less than a wavelength band of condensed light. When the incident light is a visible ray, the cross-sectional diameter of the nano-structure NP may be less than, for example, 400 nm, 300 nm, or 200 nm. In addition, a height of the nano-structure NP may be about 500 nm to about 1500 nm, which is greater than the cross-sectional diameter of the nano-structure.

The nano-structures NP may include a material having a relatively higher refractive index as compared with a peripheral material and having a relatively lower absorption ratio in the visible ray band. For example, the nano-structures NP may include c-Si, p-Si, a-Si and a Group 111-V compound semiconductor (GaP, GaN, GaAs etc.), SiC, $TiO_2$, $SiN_3$, ZnS, ZnSe, $Si_3N_4$, and/or a combination thereof. Periphery of the nano-structures NP may be filled with a dielectric material DL having a relatively lower refractive index as compared with the nano-structures NP and have a relatively low absorbent ratio in the visible ray band. For example, the periphery of the nano-structures NP may be filled with siloxane-based spin on glass (SOG), $SiO_2$, $Al_2O_3$, air, etc.

The refractive index of a high-refractive index nano-structures NP may be about 2.0 or greater with respect to the light of about 630 nm wavelength, and the refractive index of a low-refractive index dielectric material DL may be about 1.0 to about 2.0 or less with respect to the light of about 630 nm wavelength. Also, a difference between the refractive indexes of the nano-structures NP and the refractive index of the dielectric material DL may be about 0.5 or greater. The nano-structures NP having a difference in a refractive index from the refractive index of the peripheral material may change the phase of light that passes through the nano-structures NP. This is caused by phase delay that occurs due to the shape dimension of the sub-wavelength of the nanostructures NP, and a degree at which the phase is delayed, may be determined by a detailed shape dimension and arrangement shape of the nanostructures NP.

Figure 5:
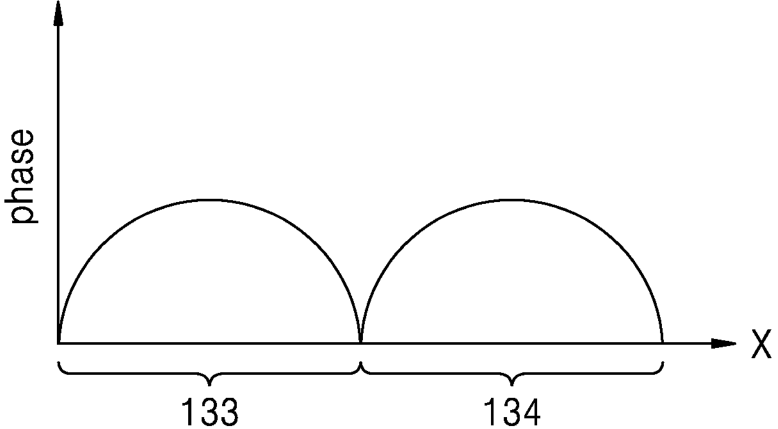
FIG. 5 is a diagram showing an example of a phase profile of light immediately after passing through nano-photonic microlenses at the center portion of a nano-photonic microlens array according to an embodiment.

FIG. 5 is a diagram showing an example of a phase profile of light immediately after passing through nano-photonic microlenses at the center portion of the nano-photonic microlens array 130 according to an embodiment. In particular, FIG. 5 shows a phase profile of light immediately after passing through the third nano-photonic microlens 133 and the fourth nano-photonic microlens 134 along line A-A' of FIG. 4 in the first direction.

At the center portion of the pixel array 1100 or the center portion of the nano-photonic microlens array 130, the incident light is incident perpendicularly to the pixel array 1100. In other words, the CRA of the incident light is 0° at the center portion of the pixel array 1100. Therefore, there is no need to change the proceeding direction of the incident light at the center portion of the pixel array 1100 or the center portion of the nano-photonic microlens array 130, and thus, the first to fourth nano-photonic microlenses 131, 132, 133, and 134 arranged at the center portion of the nano-photonic microlens array 130 may be configured to condense the incident light onto the corresponding pixel without changing the proceeding direction of the incident light.

Referring to FIG. 5, the light immediately after passing through the third nano-photonic microlens 133 has a phase profile that is largest at the center of the third nano-photonic microlens 133 and is reduced away from the center of the third nano-photonic microlens 133 in the first direction. The light immediately after passing through the fourth nano-photonic microlens 134 has a phase profile that is largest at the center of the fourth nano-photonic microlens 134 and is reduced away from the center of the fourth nano-photonic microlens 134 in the first direction. Although not shown in the drawing, the light immediately after passing through the third nano-photonic microlens 133 has a phase profile that is largest at the center of the third nano-photonic microlens 133 and is reduced away from the center, in the second direction. Also, the light immediately after passing through the fourth nano-photonic microlens 134 has a phase profile that is largest at the center of the fourth nano-photonic microlens 134 and is reduced away from the center of the fourth nano-photonic microlens 134 in the second direction.

Although not shown in FIG. 5, the light immediately after passing through the first and second nano-photonic microlenses 131 and 132 may have the phase profile having the convex curve shape that is symmetrical in the first direction and the second direction. At the center portion of the pixel array 1100 or the center portion of the nano-photonic microlens array 130 where the CRA with respect to the first and second directions is 0°, there is no need for the first to fourth nano-photonic microlenses 131, 132, 133, and 134 to change the proceeding direction of the incident light, and thus, as shown in FIG. 5, the first to fourth nano-photonic microlenses 131, 132, 133, and 134 may be configured so as to implement the phase profile that is symmetrically convex both in the first and second directions.

Referring back to FIG. 4, in order to implement the above phase profile, the plurality of nano-structures NP in each of the first to fourth nano-photonic microlenses 131, 132, 133, and 134 may be symmetrically arranged in the first and second directions with respect to the center of each of the first to fourth nano-photonic microlenses 131, 132, 133, and 134. In particular, the nano-structures NP arranged at center regions of the first to fourth nano-photonic microlenses 131, 132, 133, and 134 may each have the largest diameter such that the largest phase delay may occur at the center region of each of the first to fourth nano-photonic microlenses 131, 132, 133, and 134, and the diameters of the nano-structures NP may be gradually reduced away from the center region in each of the first to fourth nano-photonic microlenses 131, 132, 133, and 134. For example, the nano-structures NP arranged at vertex regions in each of the first to fourth nano-photonic microlenses 131, 132, 133, and 134 may have the smallest diameters.

However, the nano-structures NP arranged in the region having a relatively small phase delay do not necessarily have relatively smaller diameters. In the phase profiles shown in FIG. 5, a value of phase delay is indicated by a remainder value after subtracting the multiple of 2π. For example, when a phase delay in a certain region is 3π, the phase delay is optically the same as the remaining π after removing 2π. Therefore, when the diameter of the nano-structure NP is so small and is difficult to be manufactured, the diameter of the nano-structure NP may be selected so as to implement the delay phase increased by 2π. For example, when the diameter of the nano-structure NP for achieving the phase delay of 0.1π is too small, the diameter of the nano-structure NP may be selected so as to achieve the phase delay of 2.1π. Therefore, in this case, the nano-structures NP arranged on four vertex regions in each of the first to fourth nano-photonic microlenses 131, 132, 133, and 134 may have the largest diameters.

The phase profile of the convex curve shape allows the first to fourth nano-photonic microlenses 131, 132, 133, and 134 to act as convex lenses with respect to the incident light. Therefore, the light passed through the first to fourth nano-photonic microlenses 131, 132, 133, and 134 may be condensed onto the first to fourth pixels 111, 112, 113, and 114, respectively. However, the light of different wavelengths is condensed onto the first to fourth pixels 111, 112, 113, and 114 due to the plurality of color filters 121, 122, 123, and 124. For example, the green light may be condensed onto the first and fourth pixels 111 and 114, the blue light may be condensed onto the second pixel 112, and the red light may be condensed onto the third pixel 113.

The light may partially be scattered in an undesired direction at the boundary of each of the first to fourth nano-photonic microlenses 131, 132, 133, and 134. In particular, the light scattered due to the nano-structures NP located around the boundary of each of the first to fourth nano-photonic microlenses 131, 132, 133, and 134 may cause a crosstalk. For example, the light scattered by the nano-structures NP located around the boundary of the first nano-photonic microlens 131 may be partially incident onto the second pixel 112, the third pixel 113, or the fourth pixel 114, other than the first pixel 111. The crosstalk may degrade color purity of the image sensor 1000.

According to the embodiment, the arrangement shape and period of the nano-structures NP may be determined so as to prevent or reduce the light scattered at the boundary of each of the first to fourth nano-photonic microlenses 131, 132, 133, and 134 from being incident to other pixels not corresponding thereto. Referring to FIG. 4, in each of the first to fourth nano-photonic microlenses 131, 132, 133, and 134, the nano-structures NP may be periodically and two-dimensionally arranged in the first and second directions. In the first to fourth nano-photonic microlenses 131, 132, 133, and 134, the number of the nano-structures NP may be the same and periods or pitches of the nano-structures NP may be consistent. For example, in all the first to fourth nano-photonic microlenses 131, 132, 133, and 134, the nano-structures NP may be arranged in a first period $P_x$ in the first direction and in a second period $P_y$ in the second direction. When the first to fourth nano-photonic microlenses 131, 132, 133, and 134 have square shapes, the first period $P_x$ and the second period $P_y$ may be equal to each other.

In order to prevent or reduce the crosstalk, a gap between two nano-structures NP directly facing each other across a boundary of one color pixel to another may be greater than the arrangement period of the nano-structures NP. In other words, the arrangement period of the nano-structures NP in the first to fourth nano-photonic microlenses 131, 132, 133, and 134 may be selected to be less than the gap between the two nano-structures NP arranged directly facing each other across the boundary between two adjacent nano-photonic microlenses. Here, the gap between the two nano-structures NP may be defined as a distance between centers in cross-sections of the two nano-structures NP, not a distance between edges of the two nano-structures NP.

For example, a first gap $G_x$ between the nano-structure NP arranged at the rightmost portion of the first nano-photonic microlens 131 and the nano-structure NP arranged at the leftmost portion of the second nano-photonic microlens 132 in the first direction may be greater than the first period $P_x$ of the nano-structures NP (e.g., $G_x > P_x$). In other words, the first period $P_x$ of the nano-structures NP may be selected so that the first period $P_x$ is less than the first gap $G_x$ between the two nano-structures NP directly facing each other across the boundary between the first nano-photonic microlens 131 and the second nano-photonic microlens 132. Also, a second gap $G_y$ between the nano-structure NP arranged at the lowermost portion of the first nano-photonic microlens 131 and the nano-structure NP arranged at the uppermost portion of the third nano-photonic microlens 133 in the second direction may be greater than the second period $P_y$ of the nano-structures NP (e.g., $G_y > P_y$). In other words, the second period $P_y$ of the nano-structures NP may be selected so that the second period $P_y$ is less than the second gap $G_y$ between two nano-structures NP directly facing each other across the boundary between the first nano-photonic microlens 131 and the third nano-photonic microlens 133 in the second direction.

The relationship between the first period $P_x$ and the first gap $G_x$ in the first direction may be generalized as follows. When a width of one pixel or one nano-photonic microlens in the first direction is $W_x$ and the number of nano-structures NP arranged in the first direction in one nano-photonic microlens is $N_x$, the first period $P_x$ may be expressed by equation 1 below.

$$P_x = \frac{W_x}{N_x} - \alpha \quad \text{[Equation 1]}$$

In equation 1 above, a may have a value greater than 0. Also, a difference between the first period $P_x$ and the first gap $G_x$ may be expressed by equation 2 below.

$$G_x - P_x = N_x \cdot \alpha \quad \text{[Equation 2]}$$

The first gap $G_x$ may be expressed by equation 3 below.

$$G_x = \frac{W_x}{N_x} + (N_x - 1) \cdot \alpha \quad \text{[Equation 3]}$$

Also, the relationship between the second period $P_y$ and the second gap $G_y$ in the second direction may be applied identically.

For example, when the width of one pixel in the first direction is about 1 μm, the difference between the first period $P_x$ and the first gap $G_x$ may be between about 0 and about 300 nm (e.g., $0<G_x-P_x<300$ nm). For example, the difference between the gap between the two nano-structures NP arranged directly facing each other across a boundary between two adjacent nano-photonic microlenses for different colors and the arrangement period of the nano-structures NP may be greater than 0 and may be about 30% of the pixel width or less. In one nano-photonic microlens, when five nano-structures NP are arranged in the first direction, a may be, for example, greater than 0 and equal to or less than 60 nm. In general, the first and second gaps $G_x$ and $G_y$ may be greater than 0 and may be equal to or less than about 500 nm.

When the above condition is satisfied, a sufficient gap may be formed between the nano-structures NP located at the boundary between two adjacent nano-photonic microlenses and around the boundary in each nano-photonic microlens. Therefore, the light scattered due to the nano-structures NP located around the boundary of each of the first to fourth nano-photonic microlenses 131, 132, 133, and 134 may be prevented or reduced from being incident on the other pixels not corresponding thereto, and the color purity of the image sensor 1000 may be improved.

Figure 6:
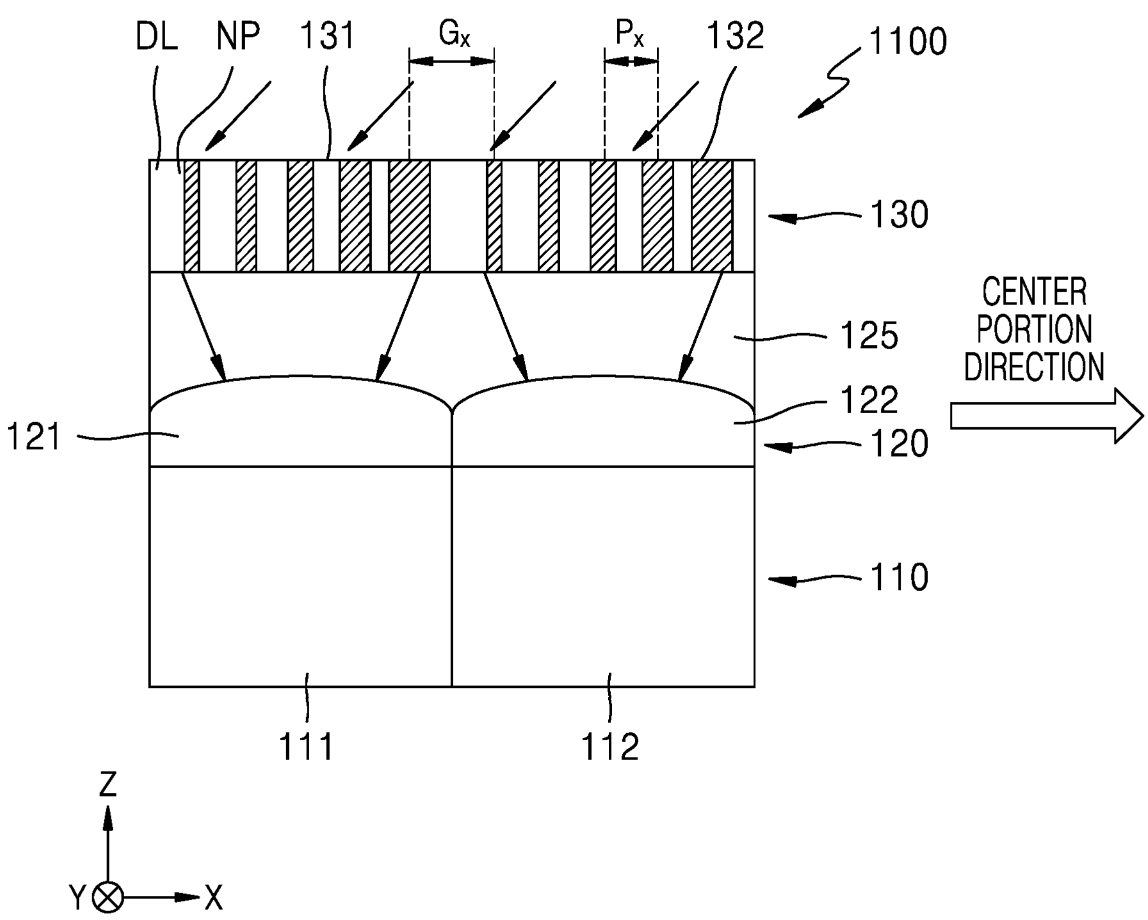
FIG. 6 is a cross-sectional view schematically showing a structure of a periphery portion of a pixel array in an image sensor according to an embodiment.

FIG. 6 is a cross-sectional view schematically showing a structure at a peripheral portion of the pixel array 1100 in the image sensor 1000 according to another embodiment. Referring to FIG. 6, at the periphery portion of the pixel array 1100 or the periphery portion of the nano-photonic microlens array 130, the incident light is incident to be inclined with respect to the pixel array 1100. The incident angle of the incident light, that is, CRA, is gradually increased from the center portion toward the periphery portion of the pixel array 1100, and is the largest at the edge of the pixel array 1100. Therefore, the first to fourth nano-photonic microlenses 131, 132, 133, and 134 arranged on the periphery portion of the nano-photonic microlens array 130 may be configured so as to deflect the incident light toward the center portion of the corresponding pixels in order to prevent or reduce degradation in the sensitivity of the pixels. Then, the first to fourth nano-photonic microlenses 131, 132, 133, and 134 may condense the incident light onto the center portions of the corresponding pixels without regard to the incident angle of the incident light.

Figure 7:
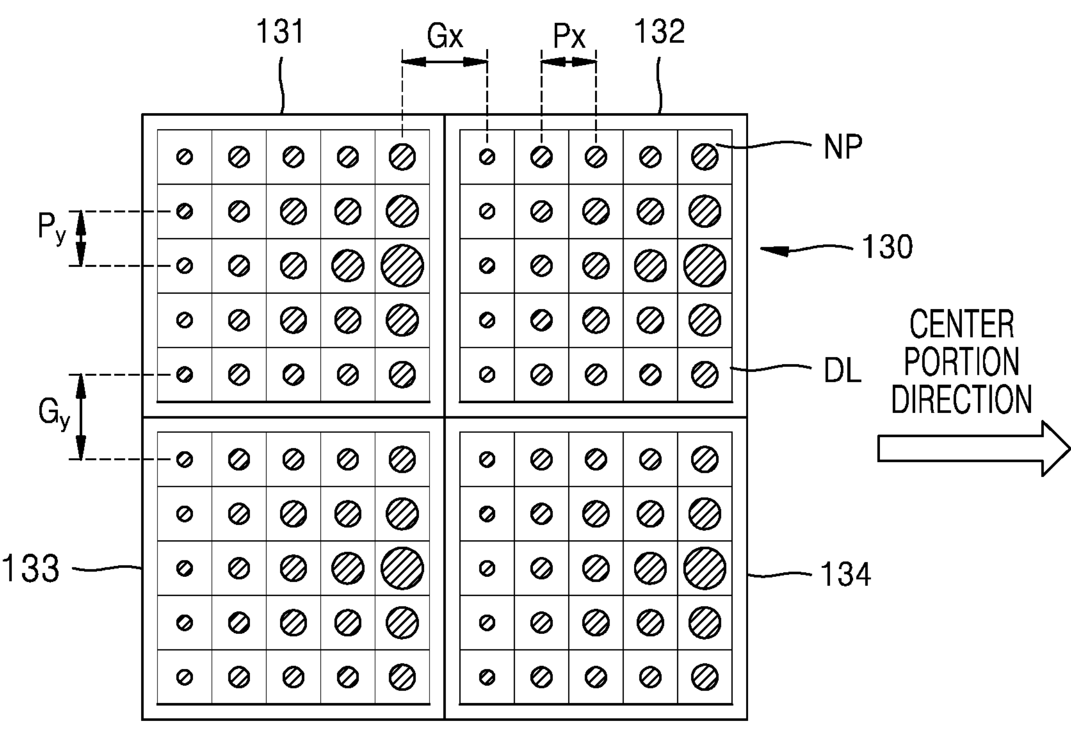
FIG. 7 is a plan view showing an example of a nano-pattern structure at a periphery portion of a nano-photonic microlens array in an image sensor according to an embodiment.
Figure 7:
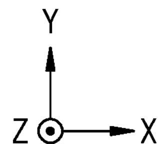
Figure 8:
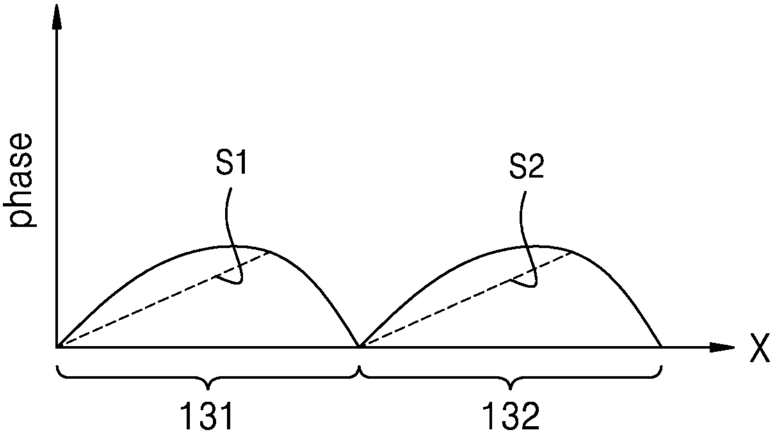
FIG. 8 is a diagram showing an example of a phase profile of light immediately after passing through nano-photonic microlenses at a periphery portion of a nano-photonic microlens array shown in FIG. 7.

To do this, the nano-structures NP arranged in each of the first to fourth nano-photonic microlenses 131, 132, 133, and 134 at the periphery portion of the pixel array 1100 or the periphery portion of the nano-photonic microlens array 130 may be designed to deflect the proceeding direction of the incident light toward the center portions of the pixels. FIG. 7 is a plan view showing an example of a nano-pattern structure at a periphery portion of the nano-photonic microlens array 130 in the image sensor 1000 according to an embodiment. In particular, FIG. 7 shows an example of a nano-pattern structure at the left edge of the nano-photonic microlens array 130. Also, FIG. 8 is a diagram showing an example of a phase profile of light immediately after passing through nano-photonic microlenses at a periphery portion of the nano-photonic microlens array 130 shown in FIG. 7. In particular, FIG. 8 shows the phase profile of the light immediately after passing through the first nano-photonic microlens 131 and the second nano-photonic microlens 132 at the periphery portion of the nano-photonic microlens array 130 shown in FIG. 7 in the first direction.

Referring to FIG. 7, when compared with the nano-pattern structure at the center portion of the nano-photonic microlens array 130, the diameters of the nano-structures NP located towards one edge of a corresponding pixel of the nano-photonic microlens array 130 may be increased. By contrast, the diameters of the nano-structures NP located at an opposite edge of the nano-photonic microlens array 130 may be reduced in each of the first to fourth nano-photonic microlenses 131, 132, 133, and 134. When comparing with the phase profile at the center portion of the nano-photonic microlens array 130, a location where the largest phase delay occurs in each of the first to fourth nano-photonic microlenses 131, 132, 133, and 134 on the periphery portion of the nano-photonic microlens array 130 may be shifted toward the center portion of the pixel array 1100 or the center portion of the nano-photonic microlens array 130. For example, an average diameter of the nano-structures NP arranged closer to the center portion of the nano-photonic microlens array 130 in each of the first to fourth nano-photonic microlenses 131, 132, 133, and 134 that are arranged at the left edge of the nano-photonic microlens array 130 may be greater than an average diameter of the nano-structures NP arranged farther from the center portion of the nano-photonic microlens array 130. Then, the location where the largest phase delay occurs in each of the first to fourth nano-photonic microlenses 131, 132, 133, and 134 that are arranged at the left edge of the nano-photonic microlens array 130 may be shifted toward the right direction from the center portion in each of the first to fourth nano-photonic microlenses 131, 132, 133, and 134.

Referring to FIG. 8, the light immediately after passing through each of the first to fourth nano-photonic microlenses 131, 132, 133, and 134 of FIG. 7 may have a phase profile in which a linear phase profile that is inclined and a convex phase profile are added. For example, the phase profile of the light immediately after passing through the first nano-photonic microlens 131 in the first direction may have a shape, in which a first linear phase profile S1 formed as an inclined straight line and a convex curved phase profile are added. Also, the phase profile of the light immediately after passing through the second nano-photonic microlens 132 in the first direction may have a shape, in which a second linear phase profile S2 formed as an inclined straight line and a convex curved phase profile are added. Therefore, the phase profiles in the first direction shown in FIG. 8 may be obtained by slanting the convexly curved phase profiles by a slope of the linear phase profiles S1 and S2. Although not shown in the drawing, the phase profiles of the light immediately after passing through the third and fourth nano-photonic microlenses 133 and 134 may have similar shapes to those of the light immediately after passing through the first and second nano-photonic microlenses 131 and 132.

The phase profile having the convex curved shape functions to condense the incident light, and the linear phase profiles S1 and S2 may deflect the proceeding direction of the incident light. The slope of the linear phase profiles S1 and S2 in the first direction may be determined according to the CRA in the first direction. The CRA in the first direction increases away from the center portion of the pixel array 1100 or the center portion of the nano-photonic microlens array 130 in the first direction. Therefore, the slope of the linear phase profile S1 and S2 in the first direction may also increase away from the center portion of the pixel array 1100 or the center portion of the nano-photonic microlens array 130 in the first direction. For example, the slope of each of the linear phase profiles S1 and S2 in the first direction may be proportional to a sin value of the incident angle of the incident light that is incident on the nano-photonic microlens array 130 in the first direction, e.g., sine value of the CRA, sin(CRA).

The CRA in the second direction at the left edge of the pixel array 1100 is 0°. Therefore, there is no need to change the proceeding direction of the incident light in the second direction, and thus, the linear phase profile has a slope of 0 in the second direction at a left edge of the pixel array 1100, and the light immediately after passing through the first to fourth nano-photonic microlenses 131, 132, 133, and 134 may have a phase profile in a convex curved shape that is symmetrical in the second direction.

Also, in order to prevent or reduce the crosstalk, the gap between two nano-structures NP arranged directly facing each other across the boundary of two adjacent nano-photonic microlenses may be greater than the arrangement period of the nano-structures NP in the periphery portion of the nano-photonic microlens array 130. For example, a first gap $G_x$ between the nano-structure NP arranged at the rightmost portion of the first nano-photonic microlens 131 and the nano-structure NP arranged at the leftmost portion of the second nano-photonic microlens 132 in the first direction may be greater than the first period $P_x$ of the nano-structures NP (e.g., $G_x > P_x$). Likewise, a second gap $G_y$ between the nano-structure NP arranged at the lowermost portion of the first nano-photonic microlens 131 and the nano-structure NP arranged at the uppermost portion of the third nano-photonic microlens 133 in the second direction may be greater than the second period $P_y$ of the nano-structures NP (e.g., $G_y > P_y$). In other words, the relationship expressed by equations 1 to 3 above describing about the center portion of the nano-photonic microlens array 130 may be identically applied throughout the entire region of the nano-photonic microlens array 130.

According to an embodiment, a value of α in equation 1 above may be consistent throughout the entire region of the nano-photonic microlens array 130. Therefore, the first period $P_x$ and the second period $P_y$ of the nano-structures NP in the first direction and the second direction may be consistent throughout the entire region of the nano-photonic microlens array 130. Also, the first gap $G_x$ and the second gap $G_y$ in the first direction and the second direction between two nano-structures NP that are arranged facing directly each other across the boundary between two nano-photonic microlenses may be consistent throughout the entire region of the nano-photonic microlens array 130.

Figure 9:
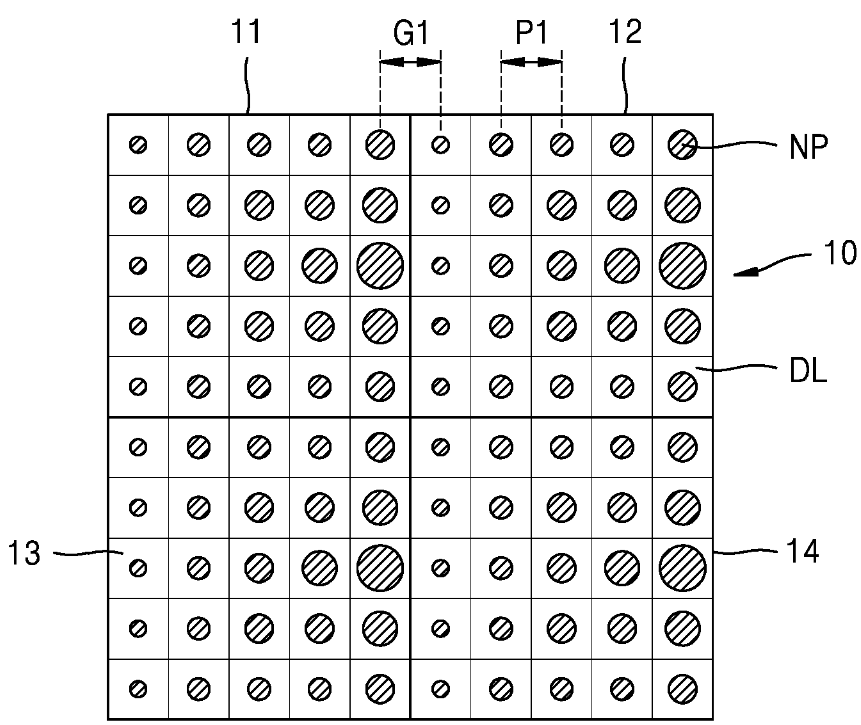
FIG. 9 is a plan view schematically showing a structure of a periphery portion of a nano-photonic microlens array according to a comparative example.
Figure 9:
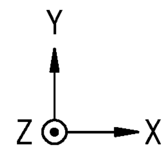

FIG. 9 is a plan view schematically showing a structure of a periphery portion of a nano-photonic microlens array 10 according to a comparative example. Referring to FIG. 9, diameters of the nano-structures NP arranged in first to fourth nano-photonic microlenses 11, 12, 13, and 14 that are arranged in a periphery portion of the nano-photonic microlens array 10 may be equal to those of the corresponding nano-structures NP in the first to fourth nano-photonic microlenses 131, 132, 133, and 134 arranged in the periphery portion of the nano-photonic microlens array 130 according to the embodiment. However, a gap G1 between two nano-structures NP arranged directly facing each other with the boundary between two adjacent nano-photonic microlenses in the nano-photonic microlens array 10 according to the comparative example may be equal to an arrangement period P1 of the nano-structures NP. In other words, the gaps among all nano-structures NP arranged in the entire region of the nano-photonic microlens array 10 according to the comparative example may be consistent.

Figure 10:
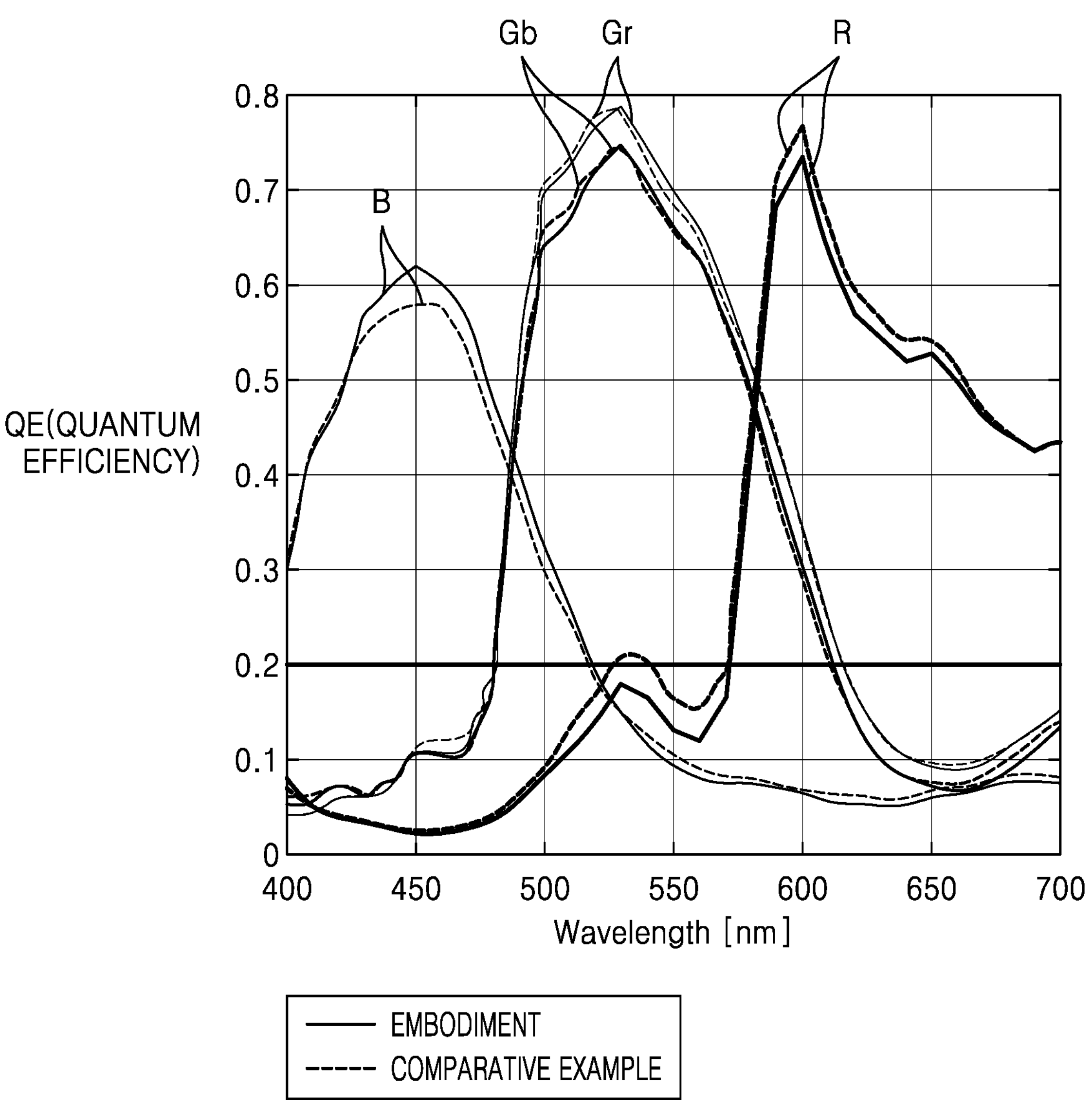
FIG. 10 is a graph showing quantum efficiencies of image sensors according to an embodiment and according to a comparative example.

FIG. 10 is a graph showing quantum efficiencies of image sensors according to an embodiment and according to a comparative example. In FIG. 10, graphs indicated by Gb, B, R, and Gr respectively denote a quantum efficiency with respect to green light in the first pixel 111, a quantum efficiency with respect to blue light in the second pixel 112, a quantum efficiency with respect to red light in the third pixel 113, and a quantum efficiency with respect to green light in the fourth pixel 114. The dashed lines denote quantum efficiencies according to the comparative example and solid lines denote quantum efficiencies according to an example embodiment in FIG. 10. Referring to FIG. 10, a crosstalk in the image sensor according to the embodiment is less than that of the image sensor according to the comparative example. In particular, the crosstalk with respect to the blue light and red light may be reduced in the image sensor according to the embodiment. For example, the crosstalk of the image sensor according to the embodiment may be reduced by about 10% as compared with that of the image sensor according to the comparative example.

The scattering due to the nano-structures NP located around the boundary in each of the first to fourth nano-photonic microlenses 131, 132, 133, and 134, which causes the crosstalk, may increase as the CRA of the incident light incident onto the nano-photonic microlens array 130 increases. Also, at the center portion of the pixel array 1100 or the center portion of the nano-photonic microlens array 130 where the CRA is close to 0°, the influence of the scattering may be less significant. Considering this, the nano-structures NP may be arranged so that the value of α in equation 1 above is roughly proportional to the CRA. For example, the value of α may be 0 at the center portion of the nano-photonic microlens array 130 and may gradually increase toward the edge of the nano-photonic microlens array 130. In other words, from the center portion of the nano-photonic microlens array 130 toward the edge of the nano-photonic microlens array 130, the arrangement period of the nano-structures NP is gradually reduced in each of the first to fourth nano-photonic microlenses 131, 132, 133, and 134, and the gap between two nano-structures NP arranged directly facing each other across the boundary between two nano-photonic microlenses may be gradually increased.

In another embodiment, the nano-photonic microlens array 130 may be divided into a plurality of sections, and then, the nano-structures NP may be arranged so that the value of α in equation 1 may be consistent in the same section. In other words, in the same section, the arrangement period of the nano-structures NP and the gaps in the first direction and the second direction between two nano-structures NP arranged directly facing each other across the boundary between two adjacent nano-photonic microlenses may be consistently maintained in the first to fourth nano-photonic microlenses 131, 132, 133, and 134. In this case, the value of α may be discontinuously changed in different two sections in the nano-photonic microlens array 130.

Figure 11:
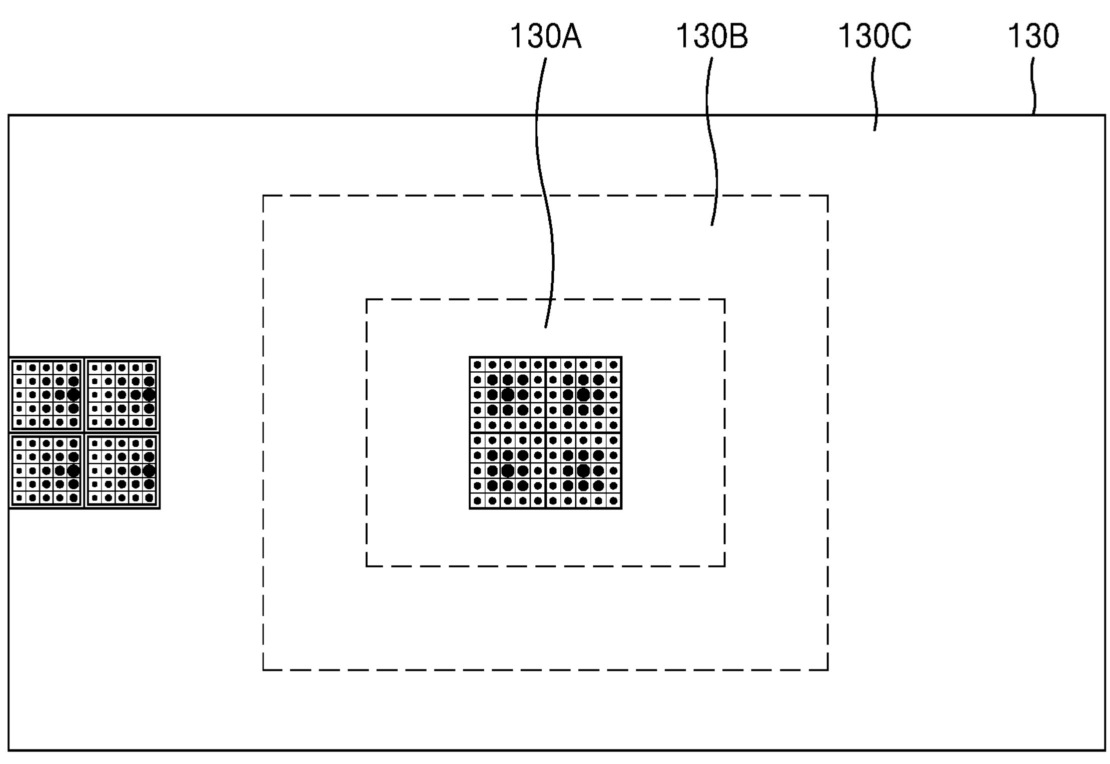
FIG. 11 is a plan view schematically showing a plurality of sections in a nano-photonic microlens array according to an embodiment.

For example, FIG. 11 is a plan view schematically showing a plurality of sections in the nano-photonic microlens array 130 according to an embodiment. Referring to FIG. 11, the nano-photonic microlens array 130 may include a first section 130A at the center portion, a second section 1308 in the periphery portion surrounding the first section 130A, and a third section 130C in the periphery portion surrounding the second section 1308. The first section 130A may correspond to the center portion of the pixel array 1100. For example, a section in which the CRA of the incident light is within about 10° may be defined as the center portion of the pixel array 1100. Therefore, the center portion of the pixel array 1100 may include a region in which the CRA is slightly greater than 0° within a certain range, as well as a region in which the CRA is strictly 0°. The CRA of the incident light in the second section 130B may be, for example, about 10° to about 20°. Also, the CRA in the incident light in the third section 130C may be, for example, about 20° or greater.

Figure 12:
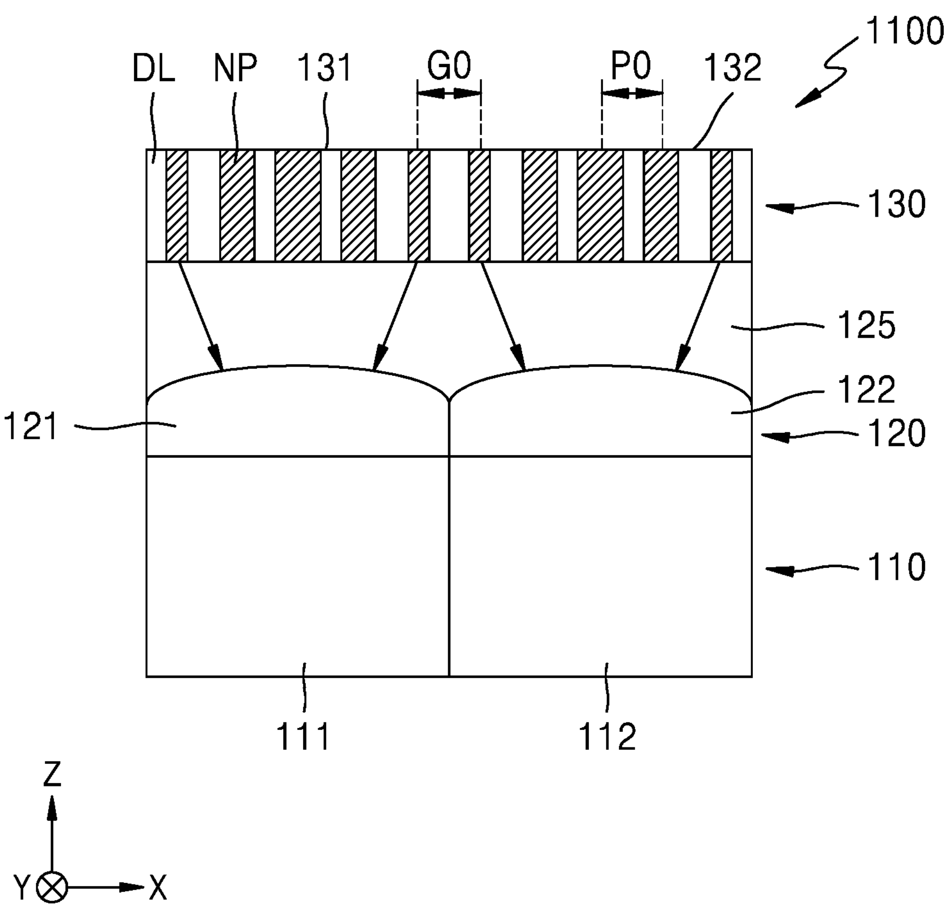
FIG. 12 is a cross-sectional view schematically showing a structure at the center portion of a pixel array in an image sensor corresponding to a first section in FIG. 11.
Figure 13:
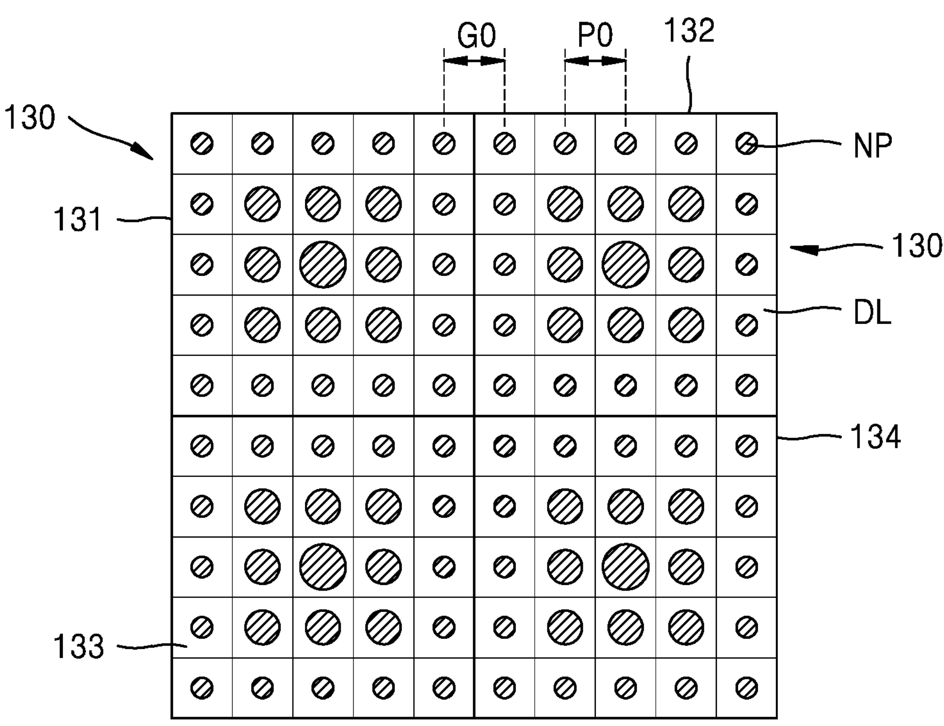
FIG. 13 is a plan view schematically showing a structure at the center portion of the nano-photonic microlens array shown in FIG. 12.
Figure 13:
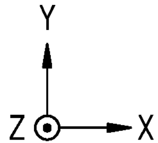

For example, the value of α in equation 1 may be 0 in the first section 130A of the center portion of the nano-photonic microlens array 130. FIG. 12 is a cross-sectional view schematically showing a structure of a center portion in the pixel array 1100 of the image sensor, which corresponds to the first section 130A of FIG. 11, and FIG. 13 is a plan view schematically showing a structure of a center portion of the nano-photonic microlens array 130 shown in FIG. 12. Referring to FIGS. 12 and 13, when the value of α in equation 1 is 0, a gap G0 between two nano-structures NP facing directly each other across the boundary between two adjacent nano-photonic microlenses may be equal to an arrangement period P0 of the nano-structures NP in the first section 130A at the center portion of the nano-photonic microlens array 130. Then, the gaps among all the nano-structures NP arranged in the first section 130A at the center portion of the nano-photonic microlens array 130 may be consistent.

The value of α in equation 1 may be set differently in the first section 130A, the second section 130B, and the third section 130C. For example, the value of α in the second section 130B may be greater than that of the first section 130A, and the value of α in the third section 130C may be greater than that of the second section 1308. Therefore, the arrangement period of the nano-structures NP in the first to fourth nano-photonic microlenses 131, 132, 133, and 134 arranged in the second section 130B may be less than that of the nano-structures NP in the first to fourth nano-photonic microlenses 131, 132, 133, and 134 arranged in the first section 130A. Also, the arrangement period of the nano-structures NP in the first to fourth nano-photonic microlenses 131, 132, 133, and 134 arranged in the third section 130C may be less than that of the nano-structures NP in the first to fourth nano-photonic microlenses 131, 132, 133, and 134 arranged in the second section 130B. Accordingly, the nano-structures NP in the first to fourth nano-photonic microlenses 131, 132, 133, and 134 may be more concentrated toward the center of the first to fourth nano-photonic microlenses 131, 132, 133, and 134, from the first section 130A toward the third section 130C.

Also, the gap between two nano-structures NP arranged facing directly each other across the boundary between the two adjacent nano-photonic microlenses in the second section 1308 may be greater than the gap between two nano-structures NP arranged facing directly across other with the boundary between two adjacent nano-photonic microlenses in the first section 130A, and the gap between two nano-structures NP arranged facing directly each other across the boundary between the two adjacent nano-photonic microlenses in the third section 130C may be greater than the gap between two nano-structures NP arranged facing directly each other across the boundary between two adjacent nano-photonic microlenses in the second section 130B. In FIG. 11, the nano-photonic microlens array 130 is divided into three sections, but is not limited thereto, that is, the number of sections is not limited to three. Also, a range of CRA of the incident light, which is a criterion for dividing a plurality of sections, may be variously selected in consideration of a size, a sensitivity, etc. of the image sensor 1000.

Figure 14:
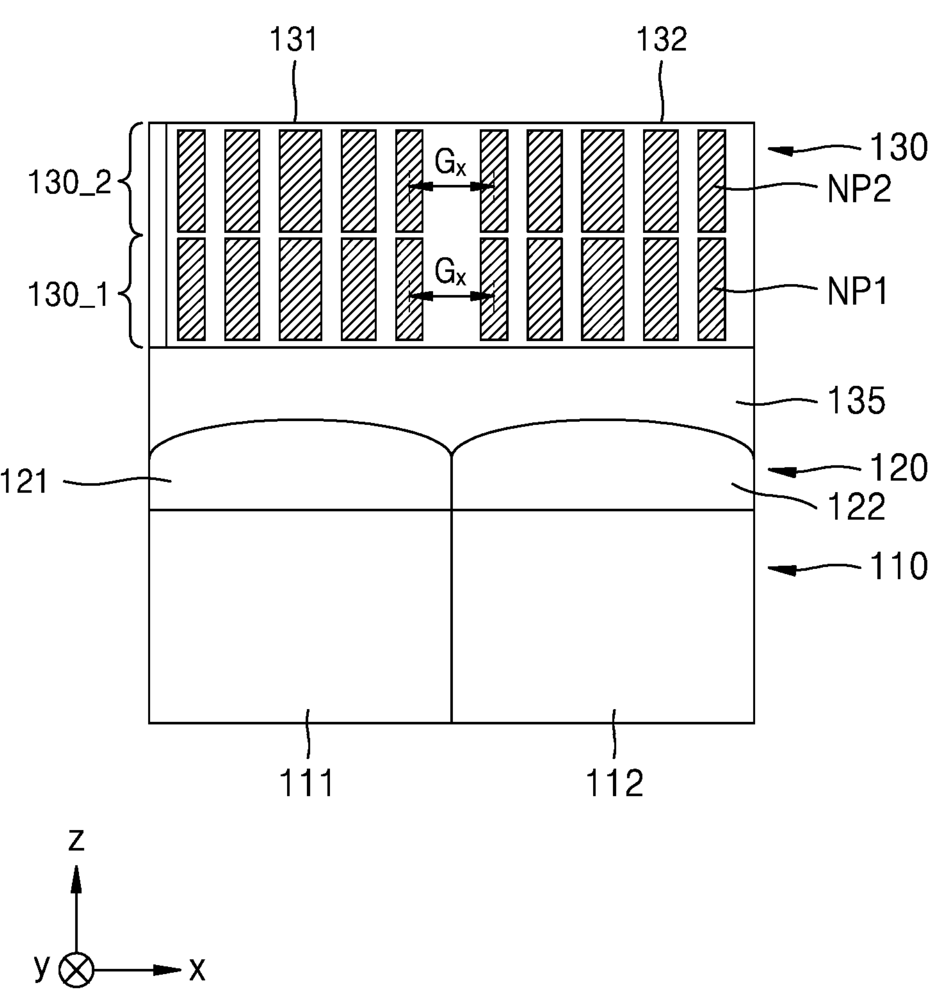
FIG. 14 is a cross-sectional view schematically showing a structure at a center portion of a pixel array in an image sensor according to another embodiment.
Figure 15:
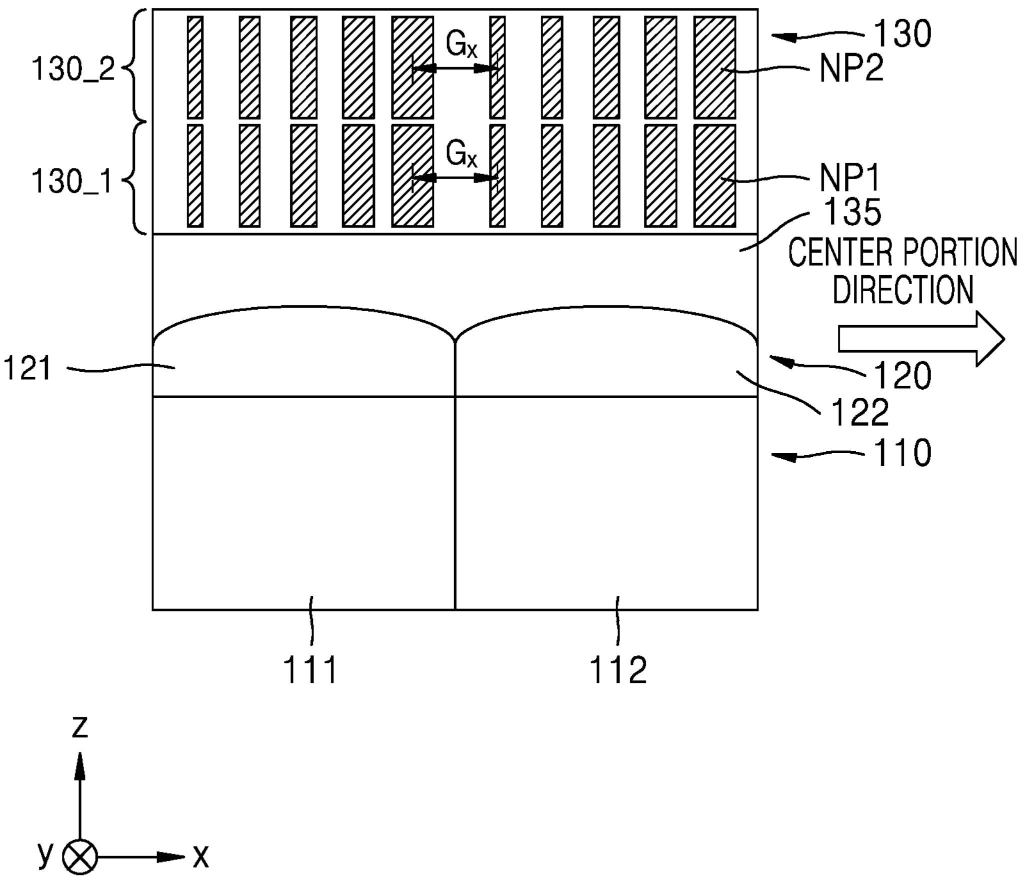
FIG. 15 is a cross-sectional view schematically showing a structure at a peripheral portion of a pixel array in an image sensor according to another embodiment.

FIG. 14 is a cross-sectional view schematically showing a structure of the center portion in the pixel array 1100 of the image sensor 130 according to another embodiment, and FIG. 15 is a cross-sectional view schematically showing a structure of a periphery portion in the pixel array 1100 of the image sensor 130 according to another embodiment. Referring to FIG. 14 and FIG. 15, the nano-photonic microlens array 130 may have a multi-layered structure including two or more layers. For example, the nano-photonic microlens array 130 may include a first nano-photonic microlens array 130_1 on the color filter layer 120, and a second nano-photonic microlens array 130_2 on the first nano-photonic microlens array 130_1. The first nano-photonic microlens array 130_1 and the second nano-photonic microlens array 130_2 may each include a plurality of nano-structures. For example, the first nano-photonic microlens array 130_1 may include a plurality of first nano-structures NP1, and the second nano-photonic microlens array 130_2 may include a plurality of second nano-structures NP2 disposed on the plurality of first nano-structures NP1. The above descriptions about the gap between two nano-structures arranged facing directly each other across the boundary between two adjacent nano-photonic microlenses and the arrangement period of the nano-structures may be also applied to each layer of the nano-structures.

For example, the gap between two first nano-structures NP1 arranged facing directly each other across the boundary between two adjacent nano-photonic microlenses may be greater than the arrangement period of the first nano-structures NP1 in each nano-photonic microlens. Also, the gap between two second nano-structures NP2 arranged facing directly each other across the boundary between two adjacent nano-photonic microlenses may be greater than the arrangement period of the second nano-structures NP2 in each nano-photonic microlens. In other words, the value of α in equation 1 with respect to the first nano-structures NP1 may be greater than 0, and the value of α in equation 1 with respect to the second nano-structures NP2 may be also greater than 0. The value of α with respect to the first nano-structures NP1 and the value of α with respect to the second nano-structures NP2 may be equal to each other. For example, the gap between two first nano-structures NP1 arranged facing directly each other across the boundary between two adjacent nano-photonic microlenses may be equal to the gap between two second nano-structures NP2 arranged facing directly each other across the boundary between two adjacent nano-photonic microlenses.

Figure 16:
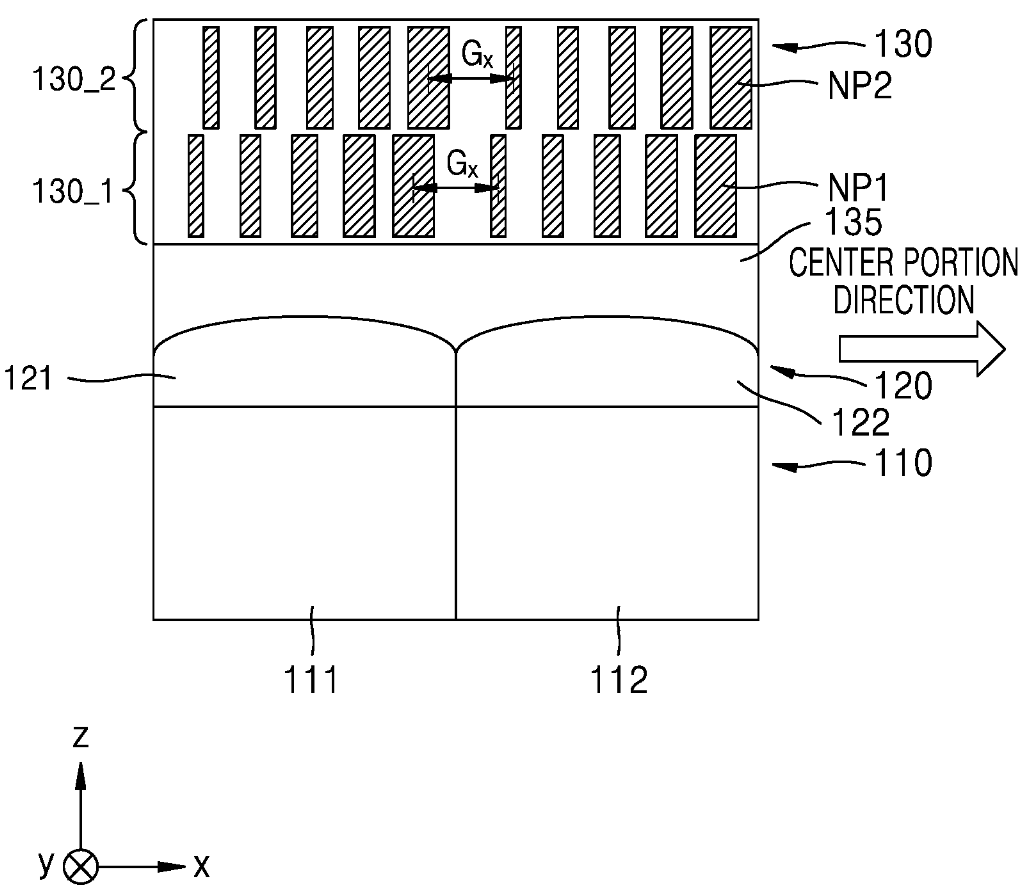
FIG. 16 is a cross-sectional view schematically showing a structure at a peripheral portion of a pixel array in an image sensor according to another embodiment.

FIG. 16 is a cross-sectional view schematically showing a structure at a peripheral portion of a pixel array in an image sensor according to another embodiment. Referring to FIG. 16, in the periphery portion of the pixel array or the periphery portion of the nano-photonic microlens array 130, the second nano-structures NP2 on the first nano-structures NP1 may be shifted toward the center portion of the pixel array or the center portion of the nano-photonic microlens array 140 with respect to the first nano-structures NP1. In this case, the gap between two second nano-structures NP2 arranged facing directly each other with the boundary between two adjacent nano-photonic microlenses may be greater than the arrangement period of the second nano-structures NP2 in each nano-photonic microlens. Also, the gap between two second nano-structures NP2 arranged facing directly each other across a boundary between two adjacent nano-photonic microlenses may be equal to the gap between two first nano-structures NP1 arranged facing directly each other across a boundary between two adjacent nano-photonic microlenses.

Figure 17:
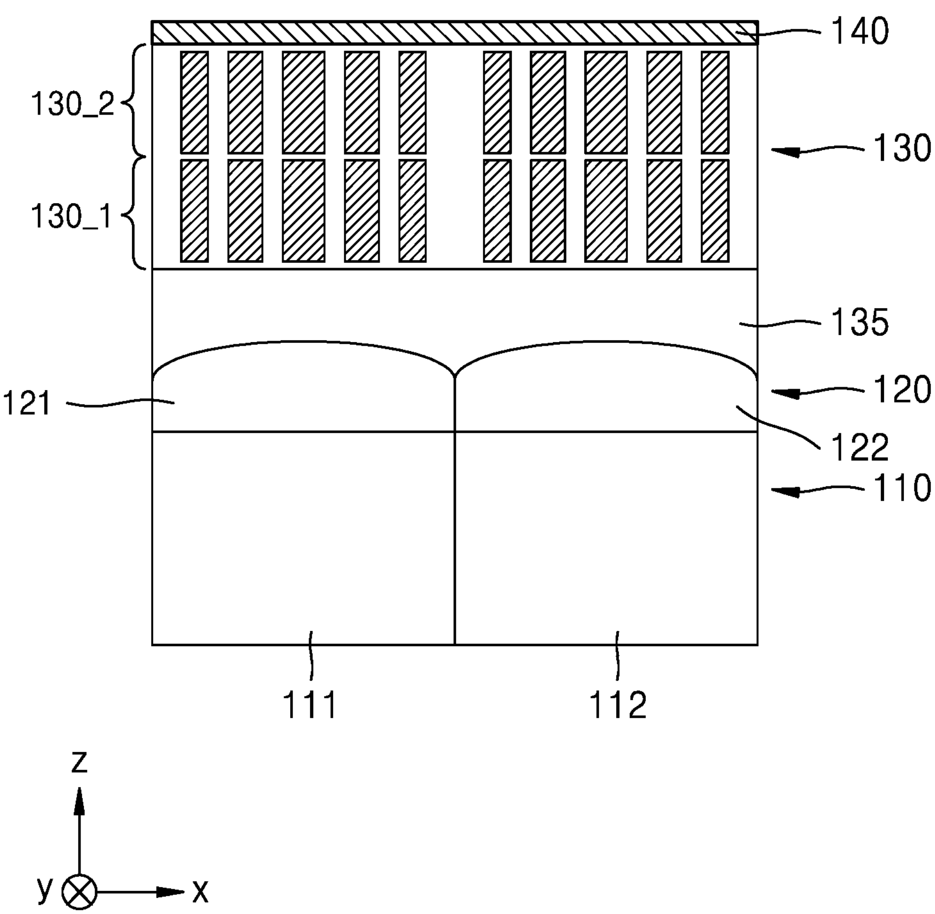
FIGS. 17 to 19 are cross-sectional views schematically showing a structure of a pixel array in an image sensor according to one or more embodiments.
Figure 18:
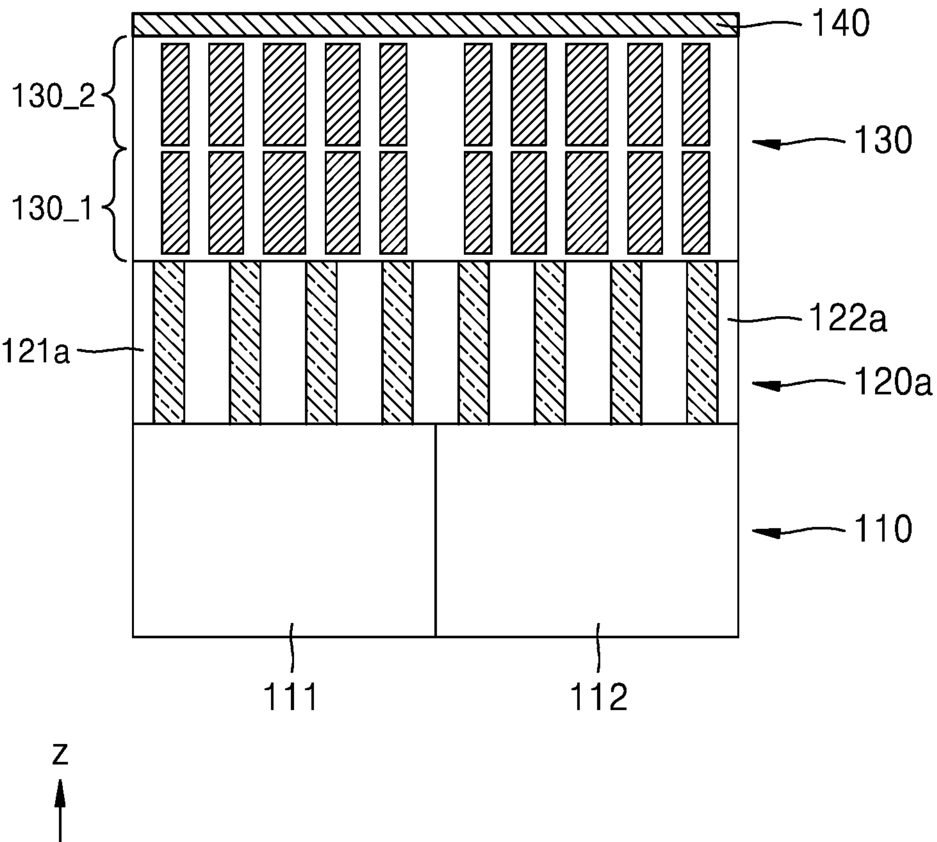
Figure 19:
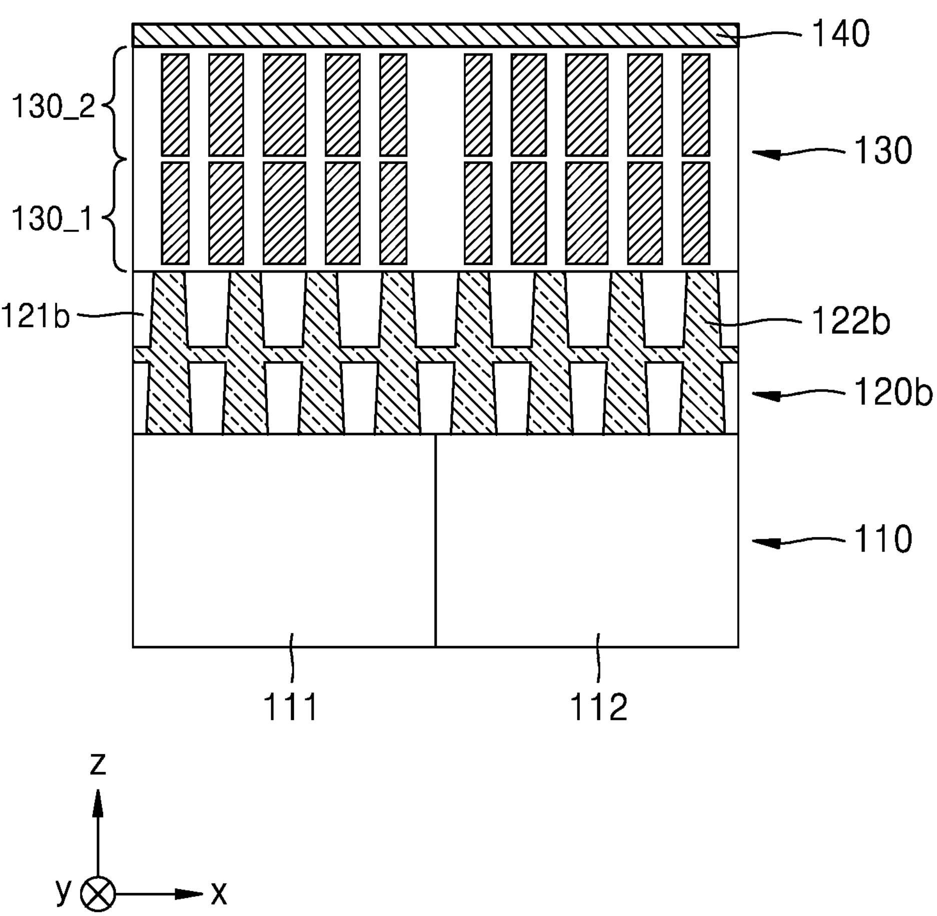

FIGS. 17 to 19 are cross-sectional views schematically showing a structure of a pixel array in an image sensor according to one or more embodiments.

Referring to FIG. 17, a pixel array may further include an anti-reflection layer 140 on a light-incident surface of the nano-photonic microlens array 130. The anti-reflection layer 140 may reduce the light reflected by the upper surface of the nano-photonic microlens array 130, and thus, may improve the light-utilization efficiency of the pixel array 1102. The anti-reflection layer 140 may include a single layer formed of a material having a refractive index that is different from that of the material included in the nano-structure of the nano-photonic microlens array 130, for example, one selected from $SiO_2$, $Si_3N_4$, and $Al_2O_3$. The anti-reflection layer 140 may have a thickness of about 80 nm to about 120 nm. Alternatively, the anti-reflection layer 140 may have a multi-layered structure in which different dielectric materials are alternately stacked. For example, the anti-reflection layer 140 may be formed by alternately stacking two or three of $SiO_2$, $Si_3N_4$, and $Al_2O_3$. Alternatively, the anti-reflection layer 140 may include various patterns for anti-reflection.

Referring to FIG. 18, the pixel array may include an inorganic color filter, instead of an organic color filter. For example, the pixel array may include an inorganic color filter layer 120*a* between the sensor substrate 110 and the nano-photonic microlens array 130. The inorganic color filter layer 120*a* may include a first inorganic color filter 121*a* arranged on the first pixel 111, and a second inorganic color filter 122*a* arranged on the second pixel 112. Although not shown in FIG. 18, the inorganic color filter layer 120*a* may further include a third inorganic color filter arranged on the third pixel 113, and a fourth inorganic color filter arranged on the fourth pixel 114.

The first inorganic color filter 121*a* may include, for example, nano-patterns that are configured to transmit green light and absorb or reflect the light of other wavelength bands. The second inorganic color filter 122*a* may include, for example, nano-patterns that are configured to transmit blue light and absorb or reflect the light of other wavelength bands. The nano-patterns of the first inorganic color filter 121*a* may be arranged to have less widths, gaps, period, etc. than the wavelength band of the green light, and the nano-patterns of the second inorganic color filter 122*a* may be arranged to have less widths, gaps, period, etc. than the wavelength of the blue light. Also, the third inorganic color filter may include nano-patterns that are configured to transmit red light and absorb or reflect the light of other wavelength bands, and the fourth inorganic color filter may include nano-patterns that are configured to transmit green light and absorb or reflect the light of other wavelength bands. In addition, a dielectric material surrounding the nano-patterns and having less refractive index than that of the nano-patterns may be filled around the nano-patterns.

Referring to FIG. 19, the pixel array may include a band pass filter, instead of an organic color filter. For example, the pixel array may include a band pass filter layer 120*b* between the sensor substrate 110 and the nano-photonic microlens array 130. The band pass filter layer 120*b* may include a first band pass filter 121*b* arranged on the first pixel 111, and a second band pass filter 122*b* arranged on the second pixel 112. Although not shown in FIG. 19, the band pass filter layer 120*b* may further include a third band pass filter arranged on the third pixel 113, and a fourth band pass filter arranged on the fourth pixel 114.

The band pass filter may have a passband different from that of a general color filter. For example, the first and second band pass filters 121*b* and 122*b* may be IR transmission filters or UV transmission filters. Alternatively, the first and second band pass filters 121*b* and 122*b* may be spectral filters for dividing the visible ray into narrower wavelength bands than that of a general color filter. The first band pass filter 121*b* may include nano-patterns configured to transmit light of a first wavelength band and to absorb or reflect light of other wavelength bands, and the second band pass filter 122*b* may include nano-patterns configured to transmit light of a second wavelength band that is different from the first wavelength band and to absorb or reflect light of other wavelength bands.

FIGS. 20 to 23 are plan views schematically showing a structure of nano-structures NP in a nano-photonic microlens array according to one or more embodiments.

The first to fourth nano-photonic microlenses 131, 132, 133, and 134 of the nano-photonic microlens array 130 may each include nano-structures NP of the same shapes. However, the diameters or arrangement types of the nano-structures NP in the first to fourth nano-photonic microlenses 131, 132, 133, and 134 may be differently set according to the wavelength of the light to be condensed. For example, the first and fourth nano-photonic microlenses 131 and 134 may be designed in consideration of a focal length with respect to the green light so that the green light may be condensed onto the first and fourth pixels 111 and 114, the second nano-photonic microlens 132 may be designed in consideration of a focal length with respect to the blue light so that the blue light may be condensed onto the second pixel 112, and the third nano-photonic microlens 133 may be designed in consideration of a focal length with respect to the red light so that the red light may be condensed onto the third pixel 113.

Figure 20:
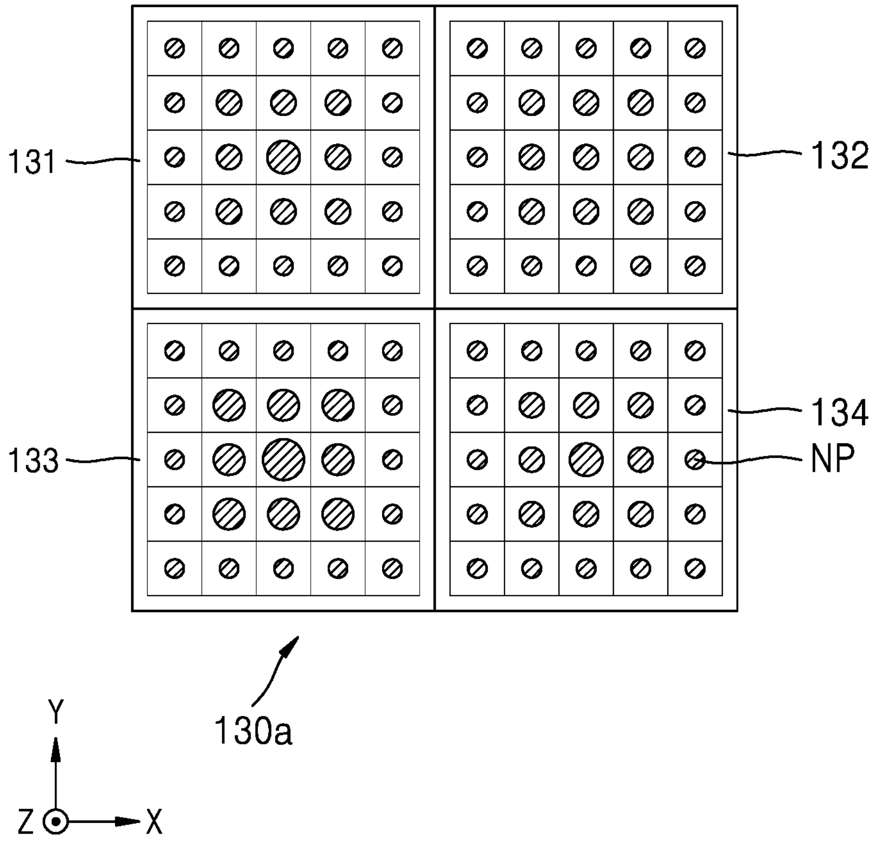
FIGS. 20 to 23 are plan views schematically showing a structure of a nano-structure in a nano-photonic microlens array according to one or more embodiments.
Figure 21:
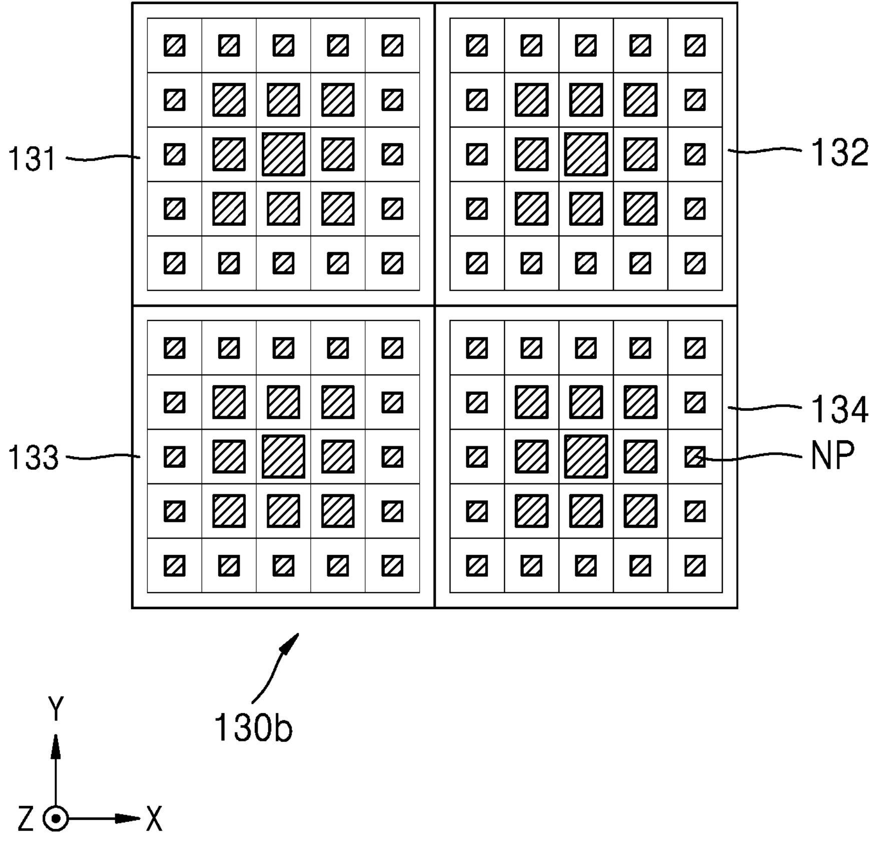

For example, in a nano-photonic microlens array 130*a* shown in FIG. 20, in order to condense the red light having the longest wavelength, the diameter of the nano-structure NP arranged at the center region of the third nano-photonic microlens 133 may be greater than those of the nano-structures NP arranged at the center regions of the first and fourth nano-photonic microlenses 131 and 134 for condensing the green light. Also, the diameters of the nano-structures NP arranged at the center regions of the first and fourth nano-photonic microlenses 131 and 134 may be greater than the diameter of the nano-structure NP arranged at the center region of the second nano-photonic microlens 132 for condensing the blue light having the shortest wavelength.

So far, the nano-structures NP are shown to have cylinder shapes, but the nano-structures NP may have other various shapes. For example, referring to FIG. 21, the nano-structures NP of a nano-photonic microlens array 130*b* may have polygonal pillar shapes, e.g., rectangular pillars. Alternatively, the nano-structures NP may have a polygonal container shape such as a rectangular container, or a circular container shape.

Figure 22:
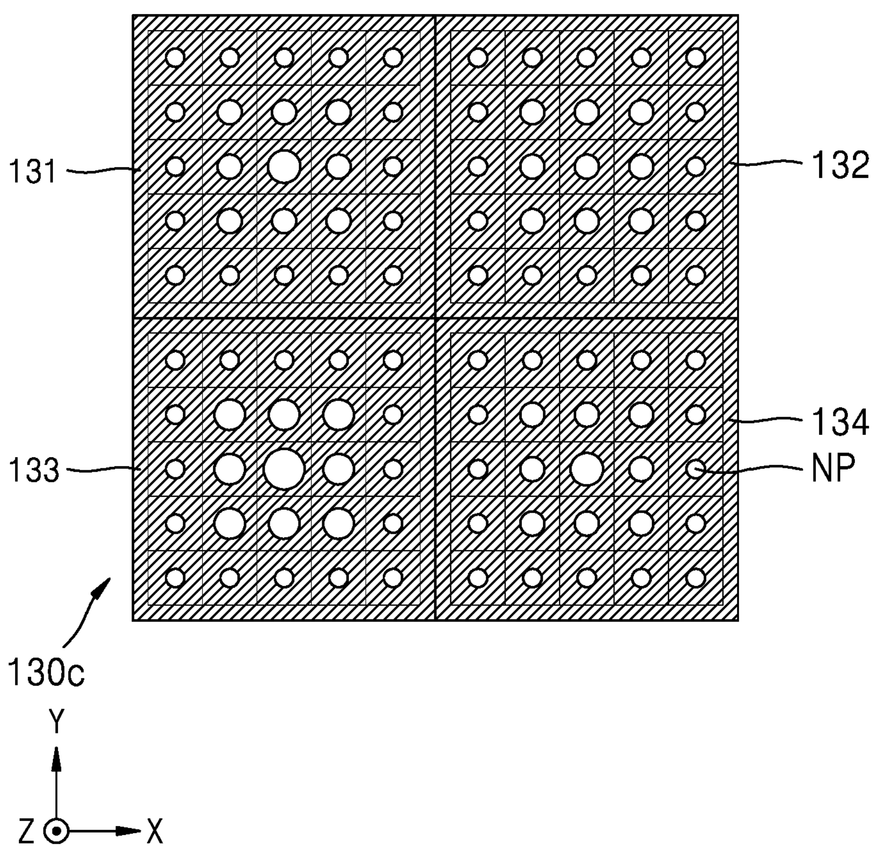

Also, referring to FIG. 22, the nano-structures NP of a nano-photonic microlens array 130*c* may have a hole-pattern shape having a low refractive index. In this case, a dielectric material having relatively high refractive index may be filled around the nano-structures NP of the hole-pattern type. For example, the nano-structures NP of the hole-pattern type may be formed by etching a dielectric layer having high refractive index.

Figure 23:
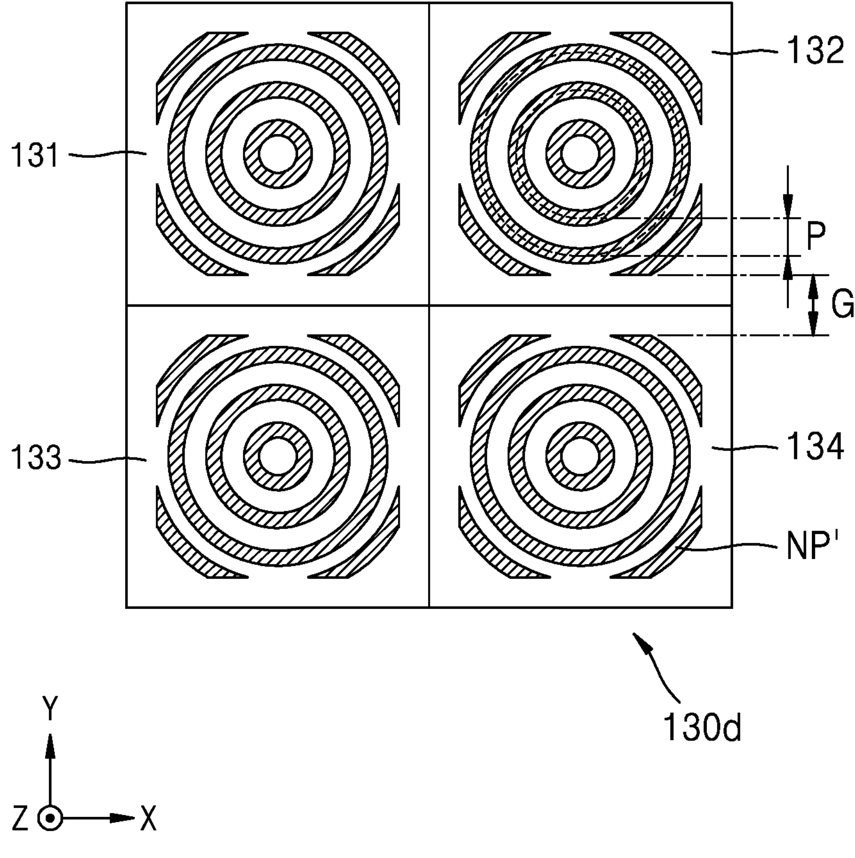

Also, referring to FIG. 23, nano-structures NP' of a nano-photonic microlens array 130*d* may have a plurality of nano-structure rings that are concentrically arranged. In this case, a gap P between two adjacent nano-structure rings in each of the first to fourth nano-photonic microlenses 131, 132, 133, and 134 may be less than a gap G between two nano-structure rings that are arranged directly facing each other across a boundary between two adjacent nano-photonic microlenses. Here, the gap between the two nano-structure rings may be defined as a difference between average radius of the two nano-structure rings, and an average radius of each nano-structure ring may be defined as an average radius between an inner radius and an outer radius of the nano-structure ring.

Figure 24:
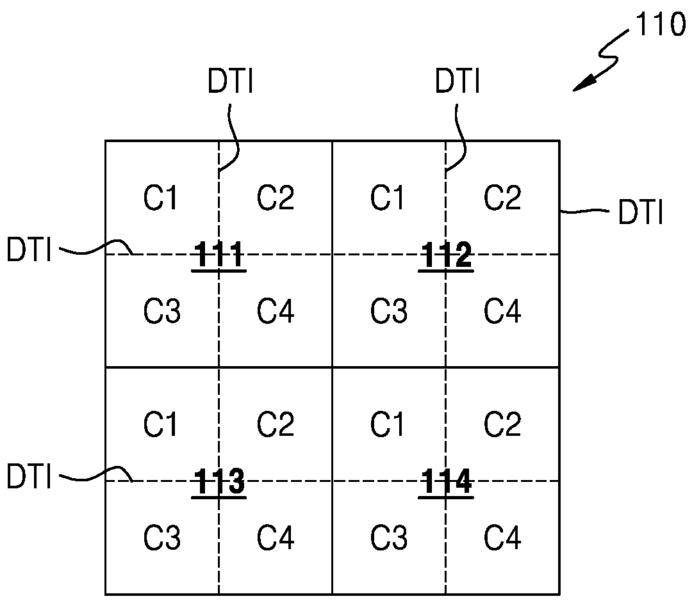
FIG. 24 is a plan view schematically showing a structure of a sensor substrate in a pixel array according to one or more embodiments.
Figure 24:
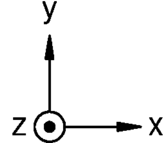

FIG. 24 is a plan view schematically showing a structure of the sensor substrate 110 in a pixel array according to one or more embodiments. Referring to FIG. 24, each of the first to fourth pixels 111, 112, 113, and 114 of the sensor substrate 110 may include a plurality of photosensitive cells that independently sense the incident light. For example, each of the first to fourth pixels 111, 112, 113, and 114 may include first to fourth photosensitive cells c1, c2, c3, and c4. The first to fourth photosensitive cells c1, c2, c3, and c4 may be two-dimensionally arranged in the first direction (X-direction) and the second direction (Y-direction). For example, in each of the first to fourth pixels 111, 112, 113, and 114, the first to fourth photosensitive cells c1, c2, c3, and c4 may be arranged in a 2×2 array. In this case, each of the first to fourth nano-photonic microlenses 131, 132, 133, and 134 of the nano-photonic microlens array 130 may be arranged facing the first to fourth photosensitive cells c1, c2, c3, and c4 of a corresponding pixel from among the first to fourth pixels 111, 112, 113, and 114.

According to the embodiment, an auto-focusing signal may be obtained from a difference between output signals of adjacent photosensitive cells. For example, an auto-focusing signal in the first direction (X-direction) may be generated from a difference between output signals from the first photosensitive cell c1 and the second photosensitive cell c2, a difference between output signals from the third photosensitive cell c3 and the fourth photosensitive cell c4, or a difference between a sum of the output signals from the first photosensitive cell c1 and the third photosensitive cell c3 and a sum of the output signals from the second photosensitive cell c2 and the fourth photosensitive cell c4. Also, an auto-focusing signal in the second direction (Y-direction) may be generated from a difference between output signals from the first photosensitive cell c1 and the third photosensitive cell c3, a difference between output signals from the second photosensitive cell c2 and the fourth photosensitive cell c4, or a difference between a sum of the output signals from the first photosensitive cell c1 and the second photosensitive cell c2 and a sum of the output signals from the third photosensitive cell c3 and the fourth photosensitive cell c4. According to the embodiment, an accuracy of an automatic focusing function that is implemented by comparing output signals from adjacent photosensitive cells may be improved by reducing the crosstalk.

In addition, a general image signal may be obtained by summing output signals from the first to fourth photosensitive cells c1, c2, c3, and c4. For example, a first green image signal may be generated by summing the output signals from the first to fourth photosensitive cells c1, c2, c3, and c4 of the first pixel 111, a blue image signal may be generated by summing the output signals from the first to fourth photosensitive cells c1, c2, c3, and c4 of the second pixel 112, a red image signal may be generated by summing the output signals from the first to fourth photosensitive cells c1, c2, c3, and c4 of the third pixel 113, and a second green image signal may be generated by summing the output signals from the first to fourth photosensitive cells c1, c2, c3, and c4 of the fourth pixel 114.

Also, each of the first to fourth pixels 111, 112, 113, and 114 may include an isolation DTI that electrically isolates the plurality of photosensitive cells from one another. The isolation DTI may have, for example, a deep trench isolation structure. The deep trench may be filled with air or an electrically insulating material. The isolation DTI may extend in the first direction (X-direction) and the second direction (Y-direction) so as to divide each of the first to fourth pixels 111, 112, 113, and 114 into four. The first to fourth photosensitive cells c1, c2, c3, and c4 in each of the first to fourth pixels 111, 112, 113, and 114 may be isolated from one another by the isolation DTI. The isolation DTI extending in the first direction (X-direction) and the isolation DTI extending in the second direction (Y-direction) may cross each other at the center of each of the first to fourth pixels 111, 112, 113, and 114.

Also, the isolation DTI may be arranged in the first direction (X-direction) and the second direction (Y-direction) between adjacent pixels from among the first to fourth pixels 111, 112, 113, and 114. Therefore, the first to fourth pixels 111, 112, 113, and 114 may be isolated from one another due to the isolation DTI. The isolation DTI extending in the first direction (X-direction) and the isolation DTI extending in the second direction (Y-direction) may cross each other at the center of the unit Bayer pattern including the first to fourth pixels 111, 112, 113, and 114.

The image sensor according to the embodiment may form a camera module along with a module lens of various functions and may be utilized in various electronic devices.

Figure 25:
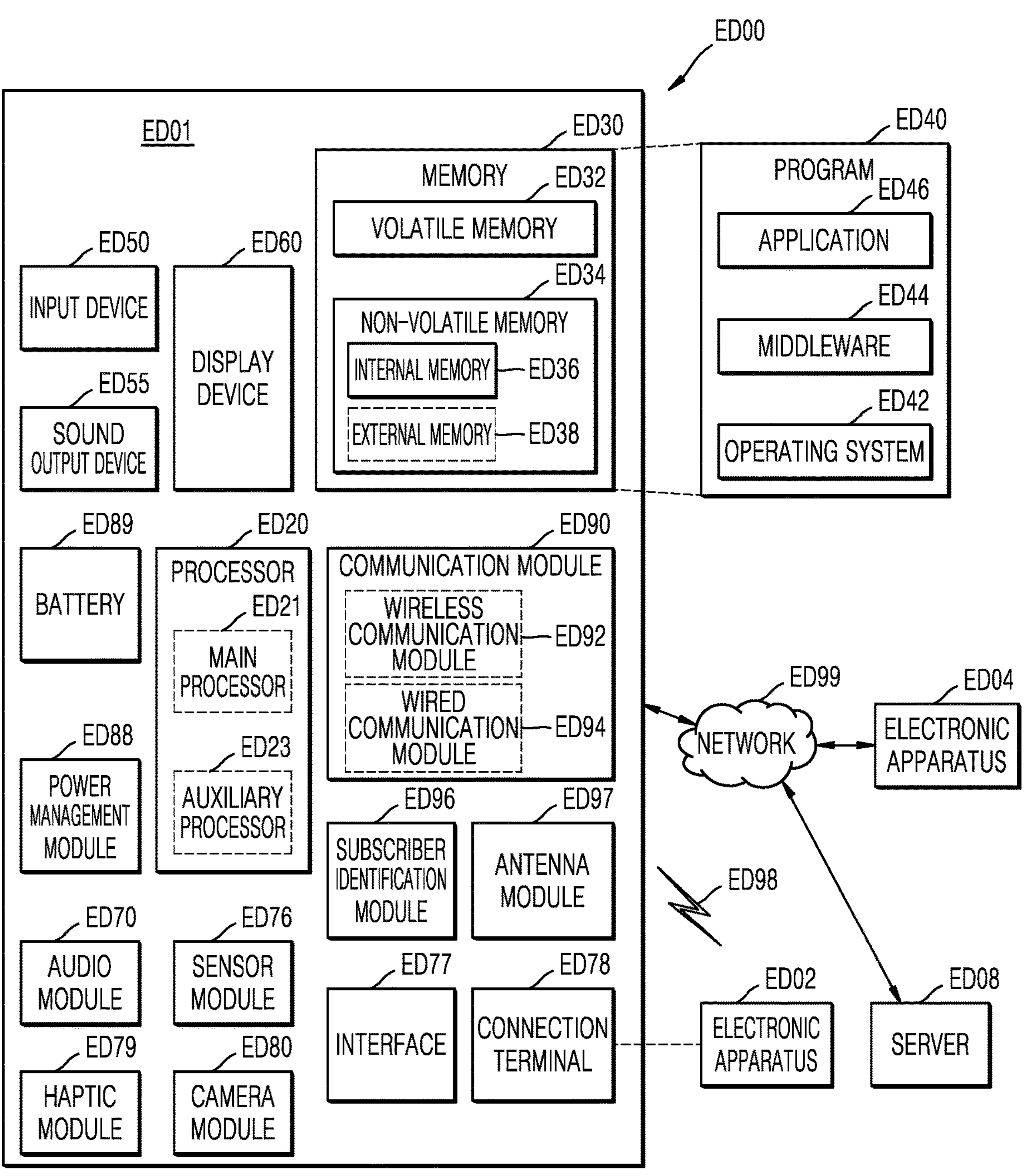
FIG. 25 is a block diagram of an electronic apparatus including an image sensor according to one or more embodiments.

FIG. 25 is a block diagram showing an example of an electronic apparatus ED01 including an image sensor 1000. Referring to FIG. 25, in a network environment ED00, the electronic apparatus ED01 may communicate with another electronic apparatus ED02 via a first network ED98 (short-range wireless communication network, etc.), or may communicate with another electronic apparatus ED04 and/or a server ED08 via a second network ED99 (long-range wireless communication network, etc.) The electronic apparatus ED01 may communicate with the electronic apparatus ED04 via the server ED08. The electronic apparatus ED01 may include a processor ED20, a memory ED30, an input device ED50, a sound output device ED55, a display device ED60, an audio module ED70, a sensor module ED76, an interface ED77, a haptic module ED79, a camera module ED80, a power management module ED88, a battery ED89, a communication module ED90, a subscriber identification module ED96, and/or an antenna module ED97. In the electronic apparatus ED01, some (display device ED60, etc.) of the elements may be omitted or another element may be added. Some of the elements may be configured as one integrated circuit. For example, the sensor module ED76 (a fingerprint sensor, an iris sensor, an illuminance sensor, etc.) may be embedded and implemented in the display device ED60 (display, etc.)

The processor ED20 may control one or more elements (hardware, software elements, etc.) of the electronic apparatus ED01 connected to the processor ED20 by executing software (program ED40, etc.), and may perform various data processes or operations. As a part of the data processing or operations, the processor ED20 may load a command and/or data received from another element (sensor module ED76, communication module ED90, etc.) to a volatile memory ED32, may process the command and/or data stored in the volatile memory ED32, and may store result data in a non-volatile memory ED34. The processor ED20 may include a main processor ED21 (central processing unit, application processor, etc.) and an auxiliary processor ED23 (graphic processing unit, image signal processor, sensor hub processor, communication processor, etc.) that may be operated independently from or along with the main processor ED21. The auxiliary processor ED23 may use less power than that of the main processor ED21, and may perform specified functions.

The auxiliary processor ED23, on behalf of the main processor ED21 while the main processor ED21 is in an inactive state (sleep state) or along with the main processor ED21 while the main processor ED21 is in an active state (application executed state), may control functions and/or states related to some (display device ED60, sensor module ED76, communication module ED90, etc.) of the elements in the electronic apparatus ED01. The auxiliary processor ED23 (image signal processor, communication processor, etc.) may be implemented as a part of another element (camera module ED80, communication module ED90, etc.) that is functionally related thereto.

The memory ED30 may store various data required by the elements (processor ED20, sensor module ED76, etc.) of the electronic apparatus ED01. The data may include, for example, input data and/or output data about software (program ED40, etc.) and commands related thereto. The memory ED30 may include the volatile memory ED32 and/or the non-volatile memory ED34.

The program ED40 may be stored as software in the memory ED30, and may include an operation system ED42, middleware ED44, and/or an application ED46.

The input device ED50 may receive commands and/or data to be used in the elements (processor ED20, etc.) of the electronic apparatus ED01, from outside (user, etc.) of the electronic apparatus ED01. The input device ED50 may include a microphone, a mouse, a keyboard, and/or a digital pen (stylus pen).

The sound output device ED55 may output a sound signal to outside of the electronic apparatus ED01. The sound output device ED55 may include a speaker and/or a receiver. The speaker may be used for a general purpose such as multimedia reproduction or record play, and the receiver may be used to receive a call. The receiver may be coupled as a part of the speaker or may be implemented as an independent device.

The display device ED60 may provide visual information to outside of the electronic apparatus ED01. The display device ED60 may include a display, a hologram device, or a projector, and a control circuit for controlling the corresponding device. The display device ED60 may include a touch circuitry set to sense a touch, and/or a sensor circuit (pressure sensor, etc.) that is set to measure a strength of a force generated by the touch.

The audio module ED70 may convert sound into an electrical signal or vice versa. The audio module ED70 may acquire sound through the input device ED50, or may output sound via the sound output device ED55 and/or a speaker and/or a headphone of another electronic apparatus (electronic apparatus ED02, etc.) connected directly or wirelessly to the electronic apparatus ED01.

The sensor module ED76 may sense an operating state (power, temperature, etc.) of the electronic apparatus ED01, or an outer environmental state (user state, etc.), and may generate an electrical signal and/or data value corresponding to the sensed state. The sensor module ED76 may include a gesture sensor, a gyro-sensor, a pressure sensor, a magnetic sensor, an acceleration sensor, a grip sensor, a proximity sensor, a color sensor, an infrared (IR) ray sensor, a vivo sensor, a temperature sensor, a humidity sensor, and/or an illuminance sensor.

The interface ED77 may support one or more designated protocols that may be used in order for the electronic apparatus ED01 to be directly or wirelessly connected to another electronic apparatus (electronic apparatus ED02, etc.) The interface ED77 may include a high-definition multimedia interface (HDMI), a universal serial bus (USB) interface, an SD card interface, and/or an audio interface.

The connection terminal ED78 may include a connector by which the electronic apparatus ED01 may be physically connected to another electronic apparatus (electronic apparatus ED02, etc.). The connection terminal ED78 may include an HDMI connector, a USB connector, an SD card connector, and/or an audio connector (headphone connector, etc.).

The haptic module ED79 may convert the electrical signal into a mechanical stimulation (vibration, motion, etc.) or an electric stimulation that the user may sense through a tactile or motion sensation. The haptic module ED79 may include a motor, a piezoelectric device, and/or an electric stimulus device.

The camera module ED80 may capture a still image and a video. The camera module ED80 may include a lens assembly including one or more lenses, the image sensor 1000 of FIG. 1, image signal processors, and/or flashes. The lens assembly included in the camera module ED80 may collect light emitted from an object that is an object to be captured.

The power management module ED88 may manage the power supplied to the electronic apparatus ED01. The power management module ED88 may be implemented as a part of a power management integrated circuit (PMIC).

The battery ED89 may supply electric power to components of the electronic apparatus ED01. The battery ED89 may include a primary battery that is not rechargeable, a secondary battery that is rechargeable, and/or a fuel cell.

The communication module ED90 may support the establishment of a direct (wired) communication channel and/or a wireless communication channel between the electronic apparatus ED01 and another electronic apparatus (electronic apparatus ED02, electronic apparatus ED04, server ED08, etc.), and execution of communication through the established communication channel. The communication module ED90 may be operated independently from the processor ED20 (application processor, etc.), and may include one or more communication processors that support the direct communication and/or the wireless communication. The communication module ED90 may include a wireless communication module ED92 (cellular communication module, a short-range wireless communication module, a global navigation satellite system (GNSS) communication module) and/or a wired communication module ED94 (local area network (LAN) communication module, a power line communication module, etc.). From among the communication modules, a corresponding communication module may communicate with another electronic apparatus via a first network ED98 (short-range communication network such as Bluetooth, WiFi direct, or infrared data association (IrDA)) or a second network ED99 (long-range communication network such as a cellular network, Internet, or computer network (LAN, WAN, etc.)). Such above various kinds of communication modules may be integrated as one element (single chip, etc.) or may be implemented as a plurality of elements (a plurality of chips) separately from one another. The wireless communication module ED92 may identify and authenticate the electronic apparatus ED01 in a communication network such as the first network ED98 and/or the second network ED99 by using subscriber information (international mobile subscriber identifier (IMSI), etc.) stored in the subscriber identification module ED96.

The antenna module ED97 may transmit or receive the signal and/or power to/from outside (another electronic apparatus, etc.). An antenna may include a radiator formed as a conductive pattern formed on a substrate (PCB, etc.). The antenna module ED97 may include one or more antennas. When the antenna module ED97 includes a plurality of antennas, from among the plurality of antennas, an antenna that is suitable for the communication type used in the communication network such as the first network ED98 and/or the second network ED99 may be selected by the communication module ED90. The signal and/or the power may be transmitted between the communication module ED90 and another electronic apparatus via the selected antenna. Another component (RFIC, etc.) other than the antenna may be included as a part of the antenna module ED97.

Some of the elements may be connected to one another via the communication method among the peripheral devices (bus, general purpose input and output (GPIO), serial peripheral interface (SPI), mobile industry processor interface (MIPI), etc.) and may exchange signals (commands, data, etc.).

The command or data may be transmitted or received between the electronic apparatus ED01 and the external electronic apparatus ED04 via the server ED08 connected to the second network ED99. Other electronic apparatuses ED02 and ED04 may be the devices that are the same as or different kinds from the electronic apparatus ED01. All or some of the operations executed in the electronic apparatus ED01 may be executed in one or more devices among the other electronic apparatuses ED02, ED04, and ED08. For example, when the electronic apparatus ED01 has to perform a certain function or service, the electronic apparatus ED01 may request one or more other electronic apparatuses to perform some or entire function or service, instead of executing the function or service by itself. One or more electronic apparatuses receiving the request execute an additional function or service related to the request and may transfer a result of the execution to the electronic apparatus ED01. To do this, for example, a cloud computing, a distributed computing, or a client-server computing technique may be used.

Figure 26:
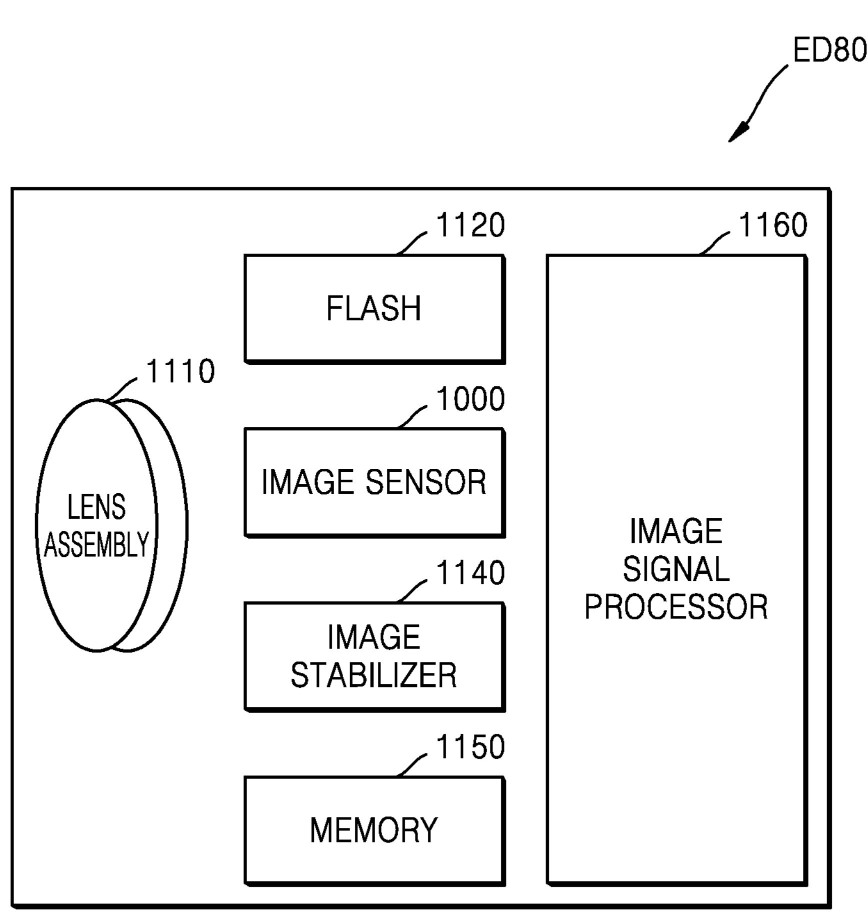
FIG. 26 is a block diagram schematically showing a camera module of FIG. 25.

FIG. 26 is a block diagram showing an example of the camera module ED80 included in the electronic apparatus ED01 of FIG. 25. Referring to FIG. 26, the camera module ED80 may include a lens assembly 1110, a flash 1120, an image sensor 1000, an image stabilizer 1140, a memory 1150 (buffer memory, etc.), and/or an image signal processor 1160. The lens assembly 1110 may collect light emitted from an object that is to be captured. The camera module ED80 may include a plurality of lens assemblies 1110, and in this case, the camera module ED80 may include a dual camera module, a 360-degree camera, or a spherical camera. Some of the plurality of lens assemblies 1110 may have the same lens properties (viewing angle, focal distance, auto-focus, F number, optical zoom, etc.) or different lens properties. The lens assembly 1110 may include a wide-angle lens or a telephoto lens.

The flash 1120 may emit light that is used to strengthen the light emitted or reflected from the object. The flash 1120 may emit visible light or infrared-ray light. The flash 1120 may include one or more light-emitting diodes (red-green-blue (RGB)) LED, white LED, infrared LED, ultraviolet LED, etc.), and/or a Xenon lamp. The image sensor 1000 may be the image sensor described above with reference to FIG. 1, and converts the light emitted or reflected from the object and transferred through the lens assembly 1110 into an electrical signal to obtain an image corresponding to the object.

The image stabilizer 1140, in response to a motion of the camera module ED80 or the electronic apparatus 1101 including the camera module ED80, moves one or more lenses included in the lens assembly 1110 or the image sensor 1000 in a certain direction or controls the operating characteristics of the image sensor 1000 (adjusting of a read-out timing, etc.) in order to compensate for a negative influence of the motion. The image stabilizer 1140 may sense the movement of the camera module ED80 or the electronic apparatus ED01 by using a gyro sensor (not shown) or an acceleration sensor (not shown) arranged in or out of the camera module ED80. The image stabilizer 1140 may be implemented as an optical type.

The memory 1150 may store some or entire data of the image obtained through the image sensor 1000 for next image processing operation. For example, when a plurality of images are obtained at a high speed, obtained original data (Bayer-patterned data, high-resolution data, etc.) is stored in the memory 1150, and a low-resolution image is only displayed. Then, original data of a selected image (user selection, etc.) may be transferred to the image signal processor 1160. The memory 1150 may be integrated with the memory ED30 of the electronic apparatus ED01, or may include an additional memory that is operated independently.

The image signal processor 1160 may perform image treatment on the image obtained through the image sensor 1000 or the image data stored in the memory 1150. The image treatments may include a depth map generation, a three-dimensional modeling, a panorama generation, extraction of features, an image combination, and/or an image compensation (noise reduction, resolution adjustment, brightness adjustment, blurring, sharpening, softening, etc.). The image signal processor 1160 may perform controlling (exposure time control, read-out timing control, etc.) of the elements (image sensor 1000, etc.) included in the camera module ED80. The image processed by the image signal processor 1160 may be stored again in the memory 1150 for additional process, or may be provided to an external element of the camera module ED80 (e.g., the memory ED30, the display device ED60, the electronic apparatus ED02, the electronic apparatus ED04, the server ED08, etc.). The image signal processor 1160 may be integrated with the processor ED20, or may be configured as an additional processor that is independently operated from the processor ED20. When the image signal processor 1160 is configured as an additional processor separately from the processor ED20, the image processed by the image signal processor 1160 undergoes through an additional image treatment by the processor ED20 and then may be displayed on the display device ED60.

Also, the image signal processor 1160 may receive two output signals independently from the adjacent photosensitive cells in each pixel or sub-pixel of the image sensor 1000, and may generate an auto-focusing signal from a difference between the two output signals. The image signal processor 1160 may control the lens assembly 1110 so that the focus of the lens assembly 1110 may be accurately formed on the surface of the image sensor 1000 based on the auto-focusing signal.

The electronic apparatus ED01 may further include one or a plurality of camera modules having different properties or functions. The camera module may include elements similar to those of the camera module ED80 of FIG. 26, and the image sensor included in the camera module may be implemented as a CCD sensor and/or a CMOS sensor and may include one or a plurality of sensors selected from the image sensors having different properties, such as an RGB sensor, a black and white (BW) sensor, an IR sensor, or a UV sensor. In this case, one of the plurality of camera modules ED80 may include a wide-angle camera and another camera module ED80 may include a telephoto camera. Similarly, one of the plurality of camera modules ED80 may include a front camera and another camera module ED80 may include a rear camera.

While the image sensor including the nano-photonic microlens array and the electronic apparatus including the image sensor have been particularly shown and described with reference to exemplary embodiments thereof, it will be understood by those of ordinary skill in the art that various changes in form and details may be made therein without departing from the spirit and scope as defined by the following claims. The example embodiments should be considered in descriptive sense only and not for purposes of limitation. Therefore, the scope of the disclosure is defined not by the detailed description of the disclosure but by the appended claims, and all differences within the scope will be construed as being included in the present disclosure.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and their equivalents.

What is claimed is:

1. An image sensor comprising:

a sensor substrate including a plurality of pixels for sensing incident light; and a nano-photonic microlens array including a plurality of nano-photonic microlenses, each of the plurality of nano-photonic microlenses corresponding respectively to one of the plurality of pixels, wherein each of the plurality of nano-photonic microlenses includes a plurality of nano-structures that are arranged two-dimensionally to condense incident light onto its corresponding respective pixel, wherein a gap between two nano-structures that are arranged directly facing each other across a boundary between two adjacent nano-photonic microlenses is greater than an arrangement period between the plurality of nano-structures in each of the plurality of nano-photonic microlenses, wherein when a width of one nano-photonic microlens in a first direction is $W_x$, the arrangement period of the plurality of nano-structures in each of the plurality of nano-photonic microlenses in the first direction is $P_x$, and a number of the nano-structures arranged in the first direction in one nano-photonic microlens is $N_x$, an equation $$P_x = \frac{W_x}{N_x} - \alpha$$

is satisfied, and

α has a value greater than 0 at a periphery portion of the nanophotonic microlens array.

2. The image sensor of claim 1, wherein in an entire area of the nano-photonic microlens array, the arrangement period of the plurality of nano-structures is consistent in each of the plurality of nano-photonic microlenses, and the gap between two nano-structures that are arranged directly facing each other across the boundary between two adjacent nano-photonic microlenses is consistent.

3. The image sensor of claim 1, wherein when the gap in the first direction between two nano-structures that are arranged directly facing each other across the boundary between two adjacent nano-photonic microlenses is $G_x$, an equation $G_x - P_x = N_x \cdot \alpha$ is satisfied.

4. The image sensor of claim 1, wherein the value of α is consistent throughout an entire area of the nano-photonic microlens array.

5. The image sensor of claim 1, wherein the value of α is 0 at a center portion of the nano-photonic microlens array.

6. The image sensor of claim 3, wherein the plurality of nano-structures are arranged so that the value of α is proportional to a chief ray angle (CRA) of incident light incident onto the nano-photonic microlens array, and the value of α is gradually or discontinuously increased toward an edge of the nano-photonic microlens array.

7. The image sensor of claim 1, wherein the nano-photonic microlens array includes a first section at a center portion and a second section at a periphery portion surrounding the first section, wherein a peripheral arrangement period of the plurality of nano-structures in the plurality of nano-photonic microlenses arranged in the second section is less than a center arrangement period of the plurality of nano-structures in the plurality of nano-photonic microlenses arranged in the first section, and a peripheral gap between two nano-structures that are arranged directly facing each other across a boundary between two adjacent nano-photonic microlenses in the second section is greater than a center gap between two nano-structures that are arranged directly facing each other across a boundary between two adjacent nano-photonic microlenses in the first section.

8. The image sensor of claim 7, wherein the center arrangement period of the plurality of nano-structures in each of the plurality of nano-photonic microlenses and the center gap between two nano-structures that are arranged directly facing each other across the boundary between two adjacent nano-photonic microlenses are consistent in the first section, and the peripheral arrangement period of the plurality of nano-structures in each of the plurality of nano-photonic microlenses and the peripheral gap between two nano-structures that are arranged directly facing each other across the boundary between two adjacent nano-photonic microlenses are consistent in the second section.

9. The image sensor of claim 7, wherein the center arrangement period of the plurality of nano-structures in each of the plurality of nano-photonic microlenses is equal to the center gap between two nano-structures that are arranged directly facing each other across the boundary between two adjacent nano-photonic microlenses in the first section.

10. The image sensor of claim 1, wherein a difference between the gap between two nano-structures that are arranged directly facing each other across the boundary between two adjacent nano-photonic microlenses and the arrangement period of the plurality of nano-structures in each of the plurality of nano-photonic microlens is about 0 to about 300 nm.

11. The image sensor of claim 10, wherein the difference between the gap between two nano-structures that are arranged directly facing each other across the boundary between two adjacent nano-photonic microlenses and the arrangement period of the plurality of nano-structures in each of the plurality of nano-photonic microlens is greater than 0 and is equal to or less than about 30% of each pixel width.

12. The image sensor of claim 1, wherein in each of the plurality of nano-photonic microlenses, the plurality of nano-structures are arranged so that light that has passed through each of the nano-photonic microlenses has a convex-shaped phase profile.

13. The image sensor of claim 12, wherein a phase profile of light that has passed through the plurality of nano-photonic microlens at a center portion of the nano-photonic microlens array has a symmetrical shape in a first direction and a symmetrical shape in a second direction.

14. The image sensor of claim 12, wherein the plurality of nano-photonic microlenses arranged on a periphery portion of the nano-photonic microlens array are configured to condense light onto a center portion of a corresponding pixel by deflecting the light that is obliquely incident on the nano-photonic microlens array.

15. The image sensor of claim 12, wherein the light that has passed through the plurality of nano-photonic microlenses arranged on a periphery portion of the nano-photonic microlens array has a phase profile, in which an inclined linear phase profile and a convex phase profile are added.

16. The image sensor of claim 1, wherein the nano-photonic microlens array includes a first nano-photonic microlens array and a second nano-photonic microlens array disposed on the first nano-photonic microlens array, the first nano-photonic microlens array includes a plurality of first nano-structures and the second nano-photonic microlens array includes a plurality of second nano-structures disposed on the first nano-structures, and a first gap between two first nano-structures that are arranged directly facing each other across a boundary between two adjacent first nano-photonic microlenses is equal to a second gap between two second nano-structures that are arranged directly facing each other across a boundary between two adjacent second nano-photonic microlenses.

17. The image sensor of claim 16, wherein in a periphery portion of the nano-photonic microlens array, the plurality of second nano-structures are shifted toward a center portion of the nano-photonic microlens array with respect to the plurality of first nano-structures.

18. An image sensor comprising:

a sensor substrate including a plurality of pixels for sensing incident light; and a nano-photonic microlens array including a plurality of nano-photonic microlenses, each of the plurality of nano-photonic microlenses corresponding respectively to one of the plurality of pixels, wherein each of the plurality of nano-photonic microlenses includes a plurality of nano-structures that are arranged two-dimensionally to condense incident light onto its corresponding respective pixel, wherein a gap between two nano-structures that are arranged directly facing each other across a boundary between two adjacent nano-photonic microlenses is greater than an arrangement period between the plurality of nano-structures in each of the plurality of nano-photonic microlenses, wherein the arrangement period of the plurality of nano-structures is gradually reduced in each of the plurality of nano-photonic microlenses from a center portion toward an edge of the nano-photonic microlens array, and the gap between two adjacent nano-structures that are arranged directly facing across the boundary between two adjacent nano-photonic microlenses is gradually increased from the center portion toward the edge of the nano-photonic microlens array.

19. An electronic apparatus comprising:

a lens assembly for forming an optical image of a subject;

an image sensor configured to convert the optical image formed by the lens assembly into an electrical signal; and a processor configured to process a signal generated by the image sensor, wherein the image sensor comprises:

a sensor substrate including a plurality of pixels for sensing incident light; and a nano-photonic microlens array including a plurality of nano-photonic microlenses, each of the plurality of nano-photonic microlenses corresponding respectively to one of the plurality of pixels, and each of the plurality of nano-photonic microlenses includes a plurality of nano-structures that are arranged two-dimensionally to condense incident light onto corresponding respective pixels, and wherein a gap between two nano-structures that are arranged directly facing each other across a boundary between two adjacent nano-photonic microlenses is greater than an arrangement period between the plurality of nano-structures in each of the plurality of nano-photonic microlens, wherein when a width of one nano-photonic microlens in a first direction is $W_x$, the arrangement period of the plurality of nano-structures in each of the plurality of nano-photonic microlenses in the first direction is $P_x$, and a number of the nano-structures arranged in the first direction in one nano-photonic microlens is $N_x$, an equation $$P_x = \frac{W_x}{N_x} - \alpha$$

is satisfied, and

α has a value greater than 0 at a periphery portion of the nanophotonic microlens array.

* * * * *